(12) United States Patent
Yokouchi et al.

(10) Patent No.: US 9,330,949 B2
(45) Date of Patent: May 3, 2016

(54) HEAT TREATMENT APPARATUS FOR HEATING SUBSTRATE BY IRRADIATING SUBSTRATE WITH FLASH OF LIGHT

(71) Applicant: DAINIPPON SCREEN MFG. CO., LTD., Kyoto (JP)

(72) Inventors: Kenichi Yokouchi, Kyoto (JP); Hideo Nishihara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 385 days.

(21) Appl. No.: 13/792,419

(22) Filed: Mar. 11, 2013

(65) Prior Publication Data
US 2013/0259457 A1 Oct. 3, 2013

(30) Foreign Application Priority Data

Mar. 27, 2012 (JP) ................................. 2012-070624
Mar. 28, 2012 (JP) ................................. 2012-073840

(51) Int. Cl.
| | | |
|---|---|---|
| *F26B 19/00* | (2006.01) | |
| *A21B 2/00* | (2006.01) | |
| *H01L 21/67* | (2006.01) | |
| *H01L 21/687* | (2006.01) | |

(52) U.S. Cl.
CPC ...... *H01L 21/67115* (2013.01); *H01L 21/6875* (2013.01); *H01L 21/68785* (2013.01)

(58) Field of Classification Search
None
See application file for complete search history.

(56) References Cited

U.S. PATENT DOCUMENTS

| 6,200,388 | B1 | 3/2001 | Jennings | |
|---|---|---|---|---|
| 6,888,104 | B1 | 5/2005 | Ranish et al. | |
| 2001/0027969 | A1* | 10/2001 | Takahashi et al. | 219/390 |
| 2003/0186563 | A1 | 10/2003 | Kobayashi et al. | |
| 2005/0149222 | A1 | 7/2005 | Kobayashi et al. | |
| 2006/0291835 | A1* | 12/2006 | Nozaki et al. | 392/416 |
| 2008/0169282 | A1* | 7/2008 | Sorabji et al. | 219/444.1 |
| 2008/0170842 | A1* | 7/2008 | Hunter et al. | 392/416 |
| 2009/0175605 | A1* | 7/2009 | Kobayashi | 392/416 |

(Continued)

FOREIGN PATENT DOCUMENTS

| JP | 2002-503884 | 2/2002 |
|---|---|---|
| JP | 2002-231713 | 8/2002 |

(Continued)

OTHER PUBLICATIONS

Office Action issued Sep. 15, 2015 by Japanese Patent Office in connection with corresponding Japanese Application No. 2012-073840 & English translations.

*Primary Examiner* — Thor Campbell
(74) *Attorney, Agent, or Firm* — Ostrolenk Faber LLP

(57) ABSTRACT

Three support members made of silicon carbide are provided fixedly on an inner periphery of the support ring. The support members are inclined at an angle in the range of 15 to 30 degrees with respect to a horizontal plane. With an outer peripheral edge of a semiconductor wafer supported by the three support members, a heating treatment is performed by irradiating the semiconductor wafer with halogen light from halogen lamps. Silicon carbide absorbs the halogen light better than quartz. The support members support the outer peripheral edge of the semiconductor wafer in point contacting relationship, so that the contact between a holder and the semiconductor wafer is minimized. This minimizes the disorder of the temperature distribution of the semiconductor wafer due to the support members to achieve the uniform heating of the semiconductor wafer.

8 Claims, 21 Drawing Sheets

(56) References Cited

U.S. PATENT DOCUMENTS

| | | | |
|---|---|---|---|
| 2009/0180766 A1* | 7/2009 | Kusuda | 392/418 |
| 2009/0245761 A1* | 10/2009 | Nakajima | 392/416 |
| 2009/0274454 A1* | 11/2009 | Aderhold et al. | 392/416 |
| 2010/0133257 A1* | 6/2010 | Sorabji et al. | 219/447.1 |
| 2010/0195992 A1* | 8/2010 | Iwata et al. | 392/416 |
| 2011/0171380 A1 | 7/2011 | Higashi et al. | |
| 2011/0253037 A1* | 10/2011 | Tsunekawa | H01L 21/67109 118/50 |
| 2013/0203269 A1* | 8/2013 | Yokouchi | 438/795 |
| 2013/0259457 A1* | 10/2013 | Yokouchi et al. | 392/416 |

FOREIGN PATENT DOCUMENTS

| | | |
|---|---|---|
| JP | 2003-249458 | 9/2003 |
| JP | 2004-047911 | 2/2004 |
| JP | 2004-063895 | 2/2004 |
| JP | 3109840 | 4/2005 |
| JP | 2007-184625 | 7/2007 |
| JP | 2009-164451 | 7/2009 |
| JP | 2011-014682 | 1/2011 |

* cited by examiner

F I G. 2
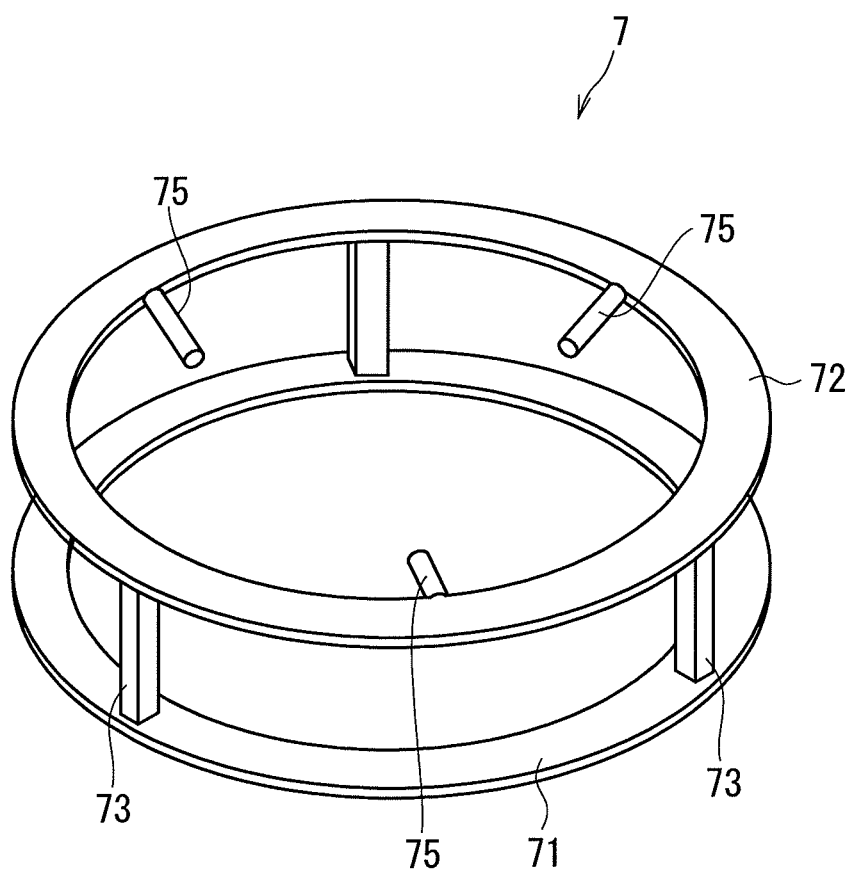

F I G. 3
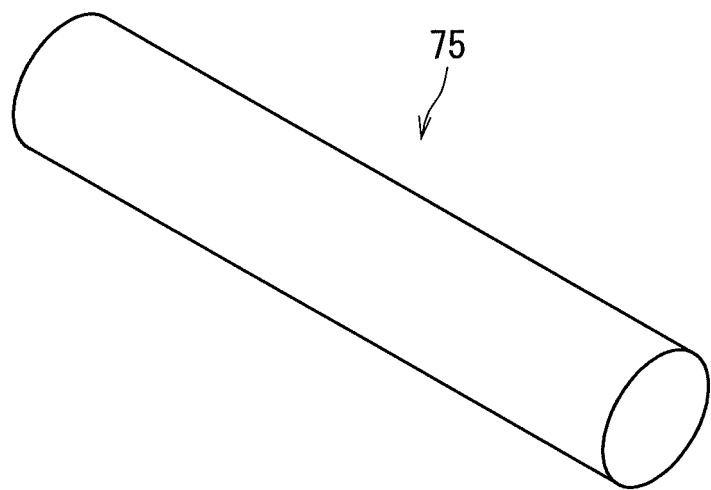

F I G. 7
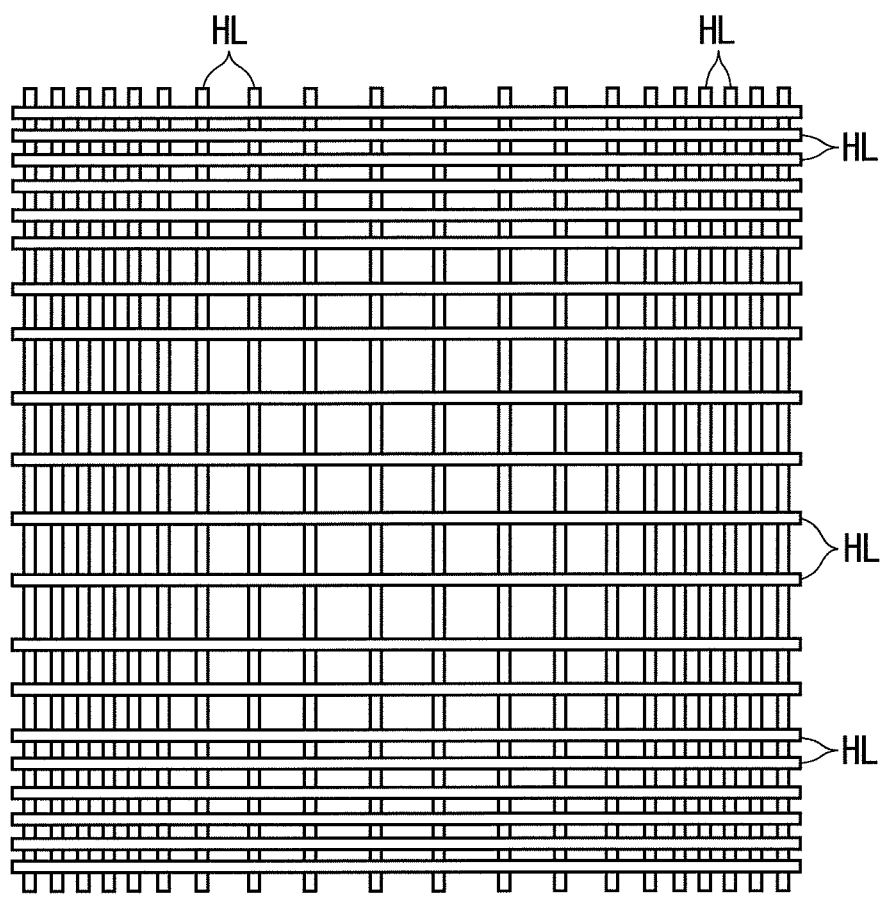

F I G. 8
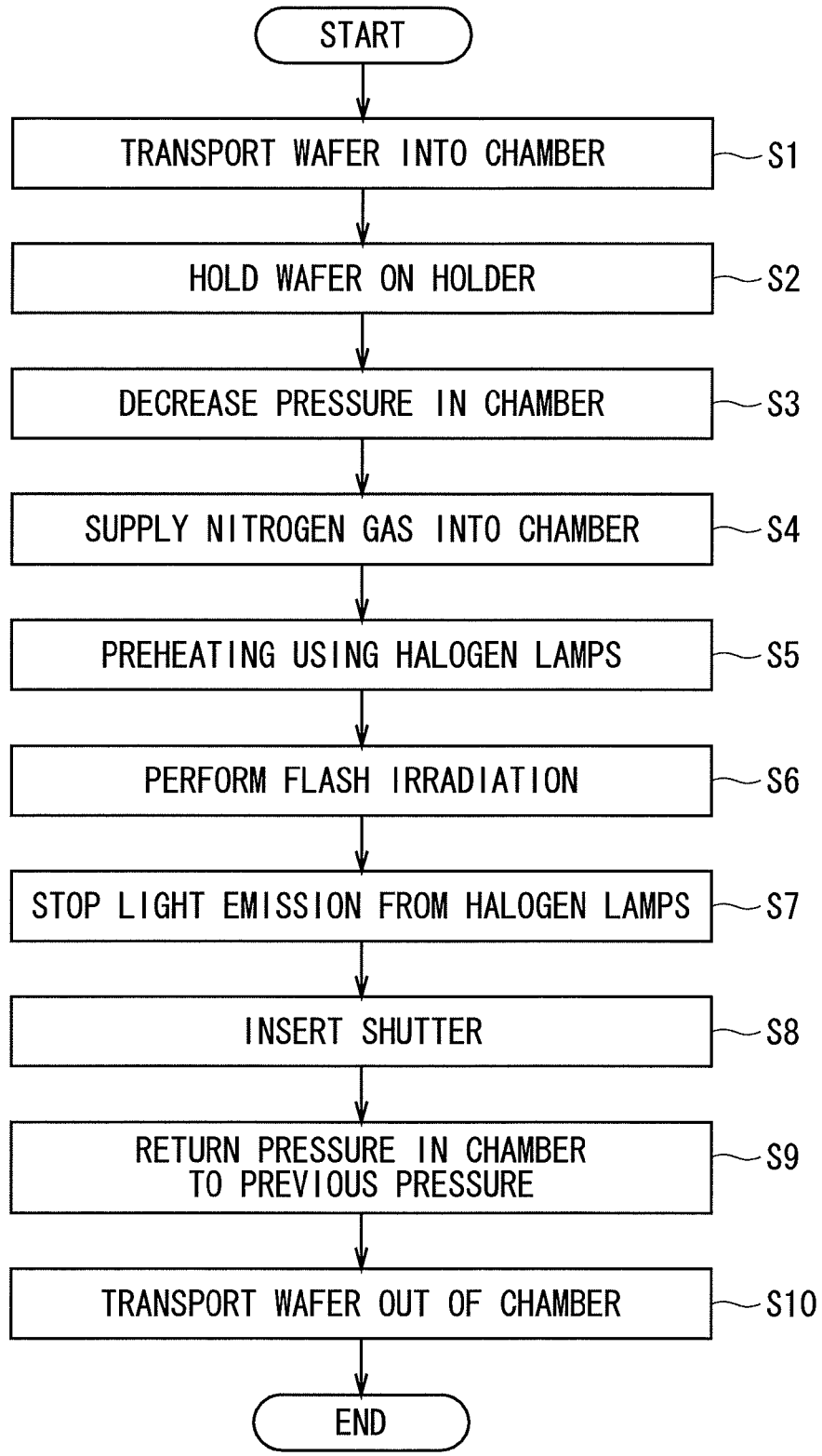

F I G. 9
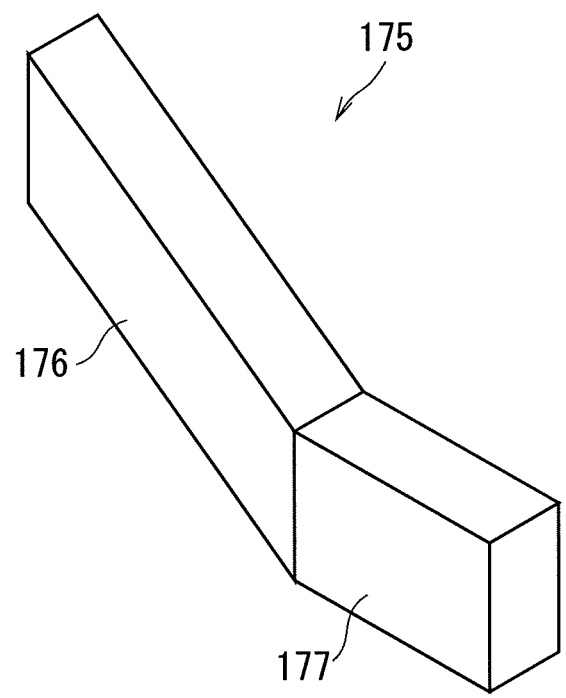

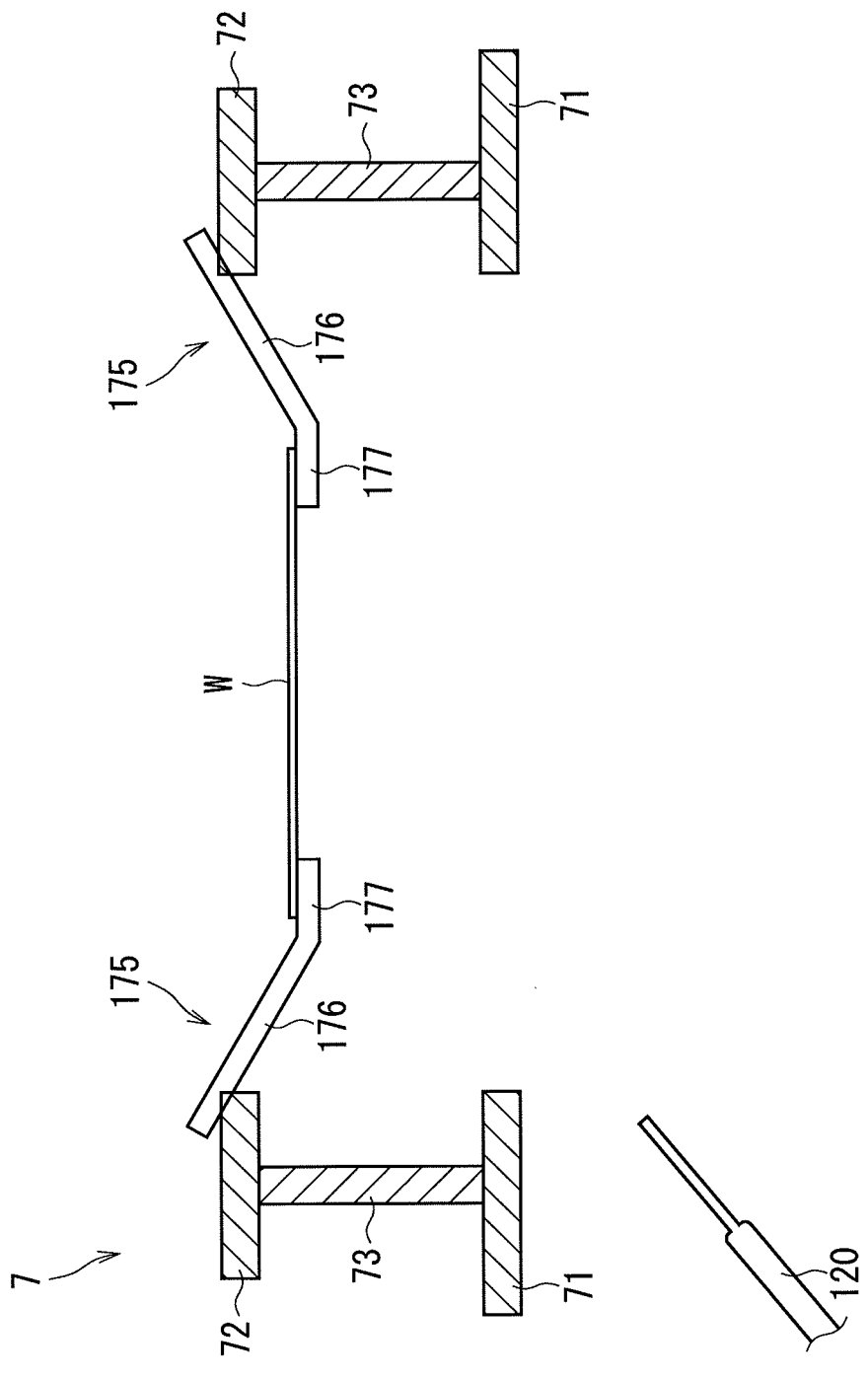

F I G. 1 1
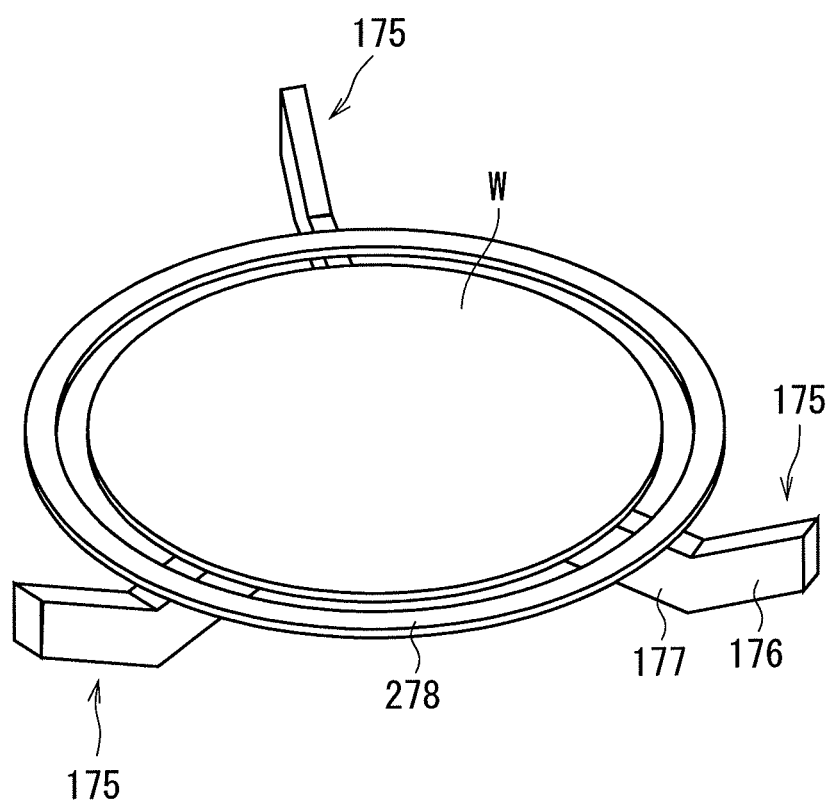

F I G. 1 2 A
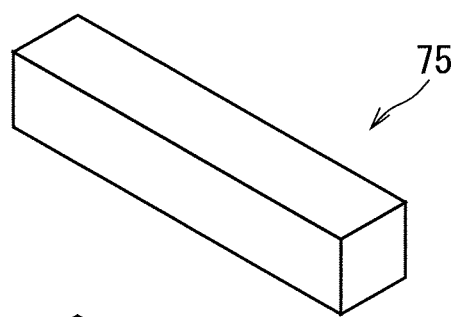
F I G. 1 2 B
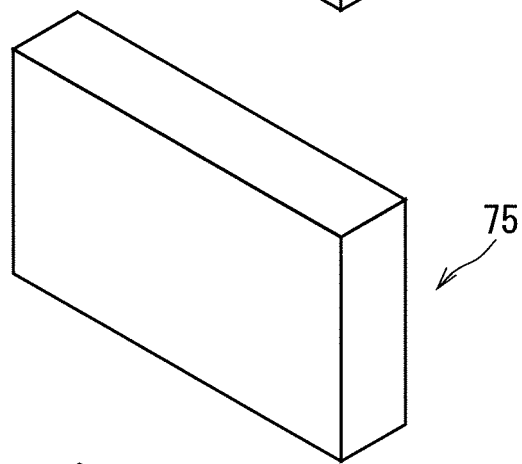
F I G. 1 2 C
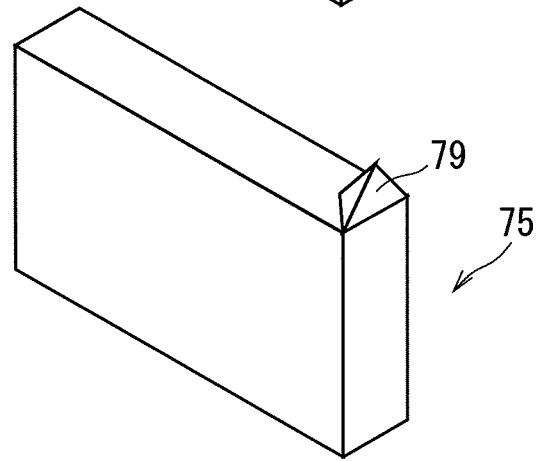

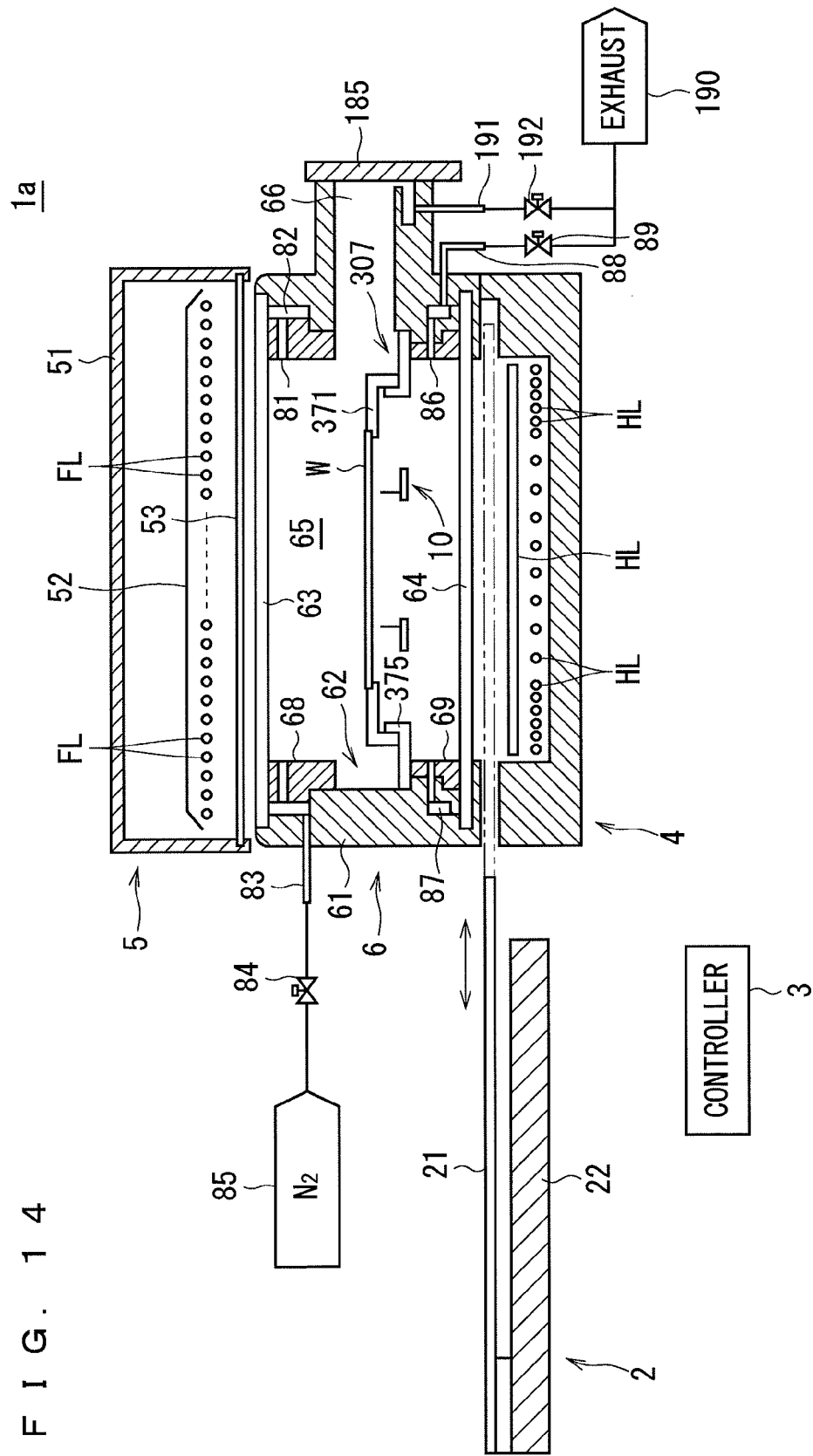
F I G . 1 4

F I G. 1 5
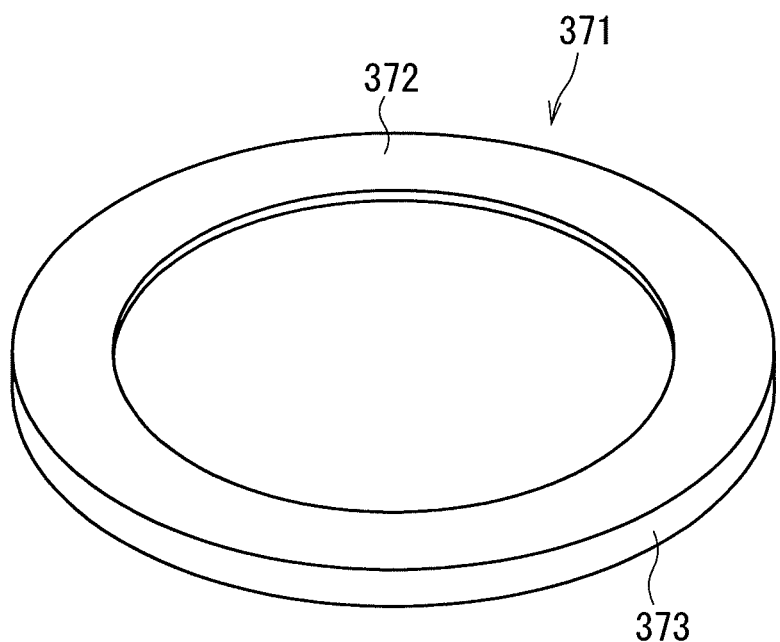

F I G. 1 6
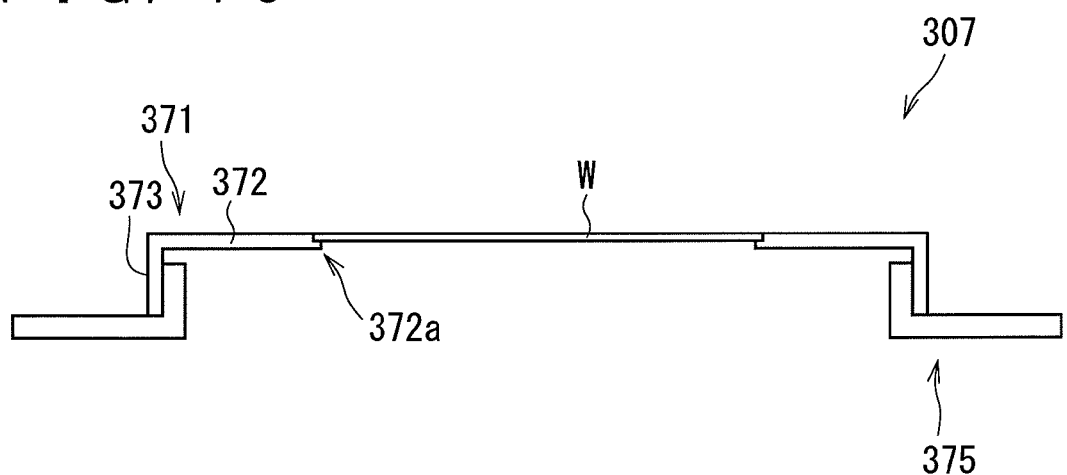

F I G. 1 8
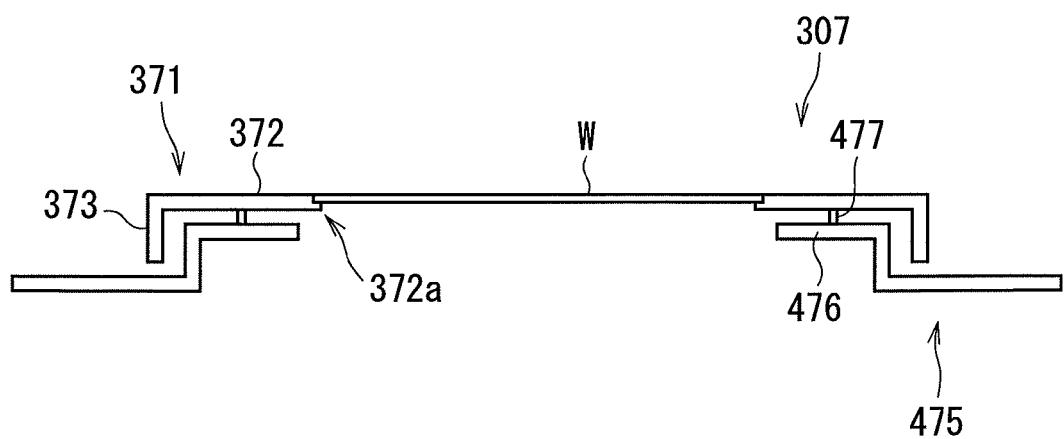

F I G. 1 9
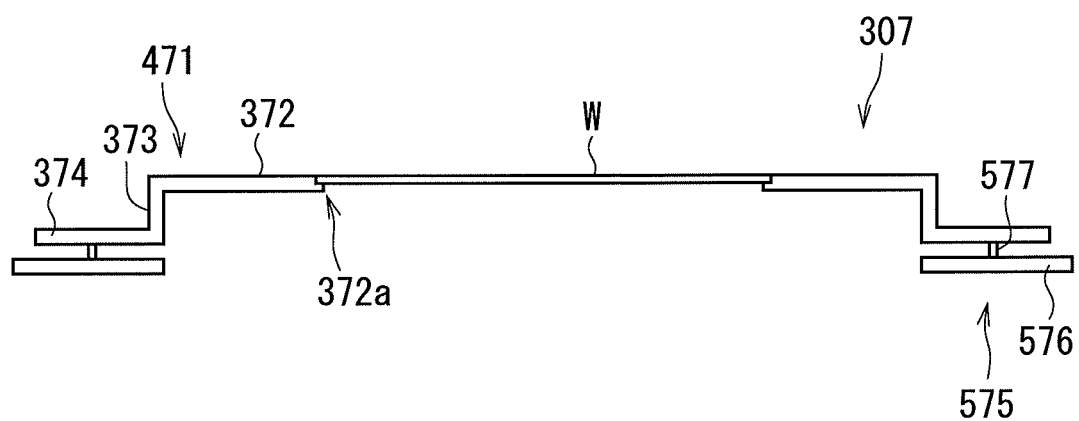

HEAT TREATMENT APPARATUS FOR HEATING SUBSTRATE BY IRRADIATING SUBSTRATE WITH FLASH OF LIGHT

BACKGROUND OF THE INVENTION

1. Field of the Invention

The present invention relates to a heat treatment apparatus for heating a thin plate-like precision electronic substrate such as a semiconductor wafer and a glass substrate for a liquid crystal display device (hereinafter referred to simply as a "substrate") by irradiating the substrate with a flash of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus which employs such xenon flash lamps is disclosed in U.S. Patent Application Publication No. 2009/0175605 in which flash lamps are disposed on the front surface side of a semiconductor wafer and halogen lamps are disposed on the back surface side thereof so that a desired heat treatment is performed using a combination of these lamps. In the heat treatment apparatus disclosed in U.S. Patent Application Publication No. 2009/0175605, a semiconductor wafer held on a susceptor is preheated to a certain degree of temperature by the halogen lamps. Thereafter, the temperature of the semiconductor wafer is raised to a desired treatment temperature by flash irradiation from the flash lamps.

The heat treatment apparatus disclosed in U.S. Patent Application Publication No. 2009/0175605 includes a quartz plate for holding a semiconductor wafer during the flash irradiation. The quartz plate has an opening provided for a radiation therometer to measure the temperature of the semiconductor wafer therethrough. The temperature of the semiconductor wafer during the preheating is lower in a region lying immediately over the opening than in other regions. Also, the decrease in temperature is prone to occur in a peripheral portion of the semiconductor wafer during the preheating using the halogen lamps. As a result of these facts, a problem has arisen in which the in-plane temperature distribution of the semiconductor wafer is nonuniform during the flash irradiation.

In the heat treatment apparatus as disclosed in U.S. Patent Application Publication No. 2009/0175605, preheating prior to flash heating is performed by irradiating a semiconductor wafer held on a susceptor made of quartz with halogen light from the halogen lamps. When the temperature of the semiconductor wafer is increased during the preheating, the temperature of the susceptor that holds the semiconductor wafer does not increase so much because quartz allows halogen light to pass therethrough. This causes variations in temperature distribution such that the temperature of the semiconductor wafer is decreased, in particular, near a portion thereof in contact with the susceptor and in a peripheral portion thereof.

To prevent such variations, it is contemplated that a temperature equalizing ring made of, for example, silicon carbide the temperature of which is increased by absorbing halogen light is used to support a semiconductor wafer. However, if the temperature equalizing ring made of silicon carbide is used in a flash lamp annealer, only the front surface of the temperature equalizing ring is heated by the flash irradiation, so that the temperature of the front surface of the temperature equalizing ring increases abruptly. The thermal expansion of the front surface of the semiconductor wafer at that time causes warpage to occur, resulting in vibrations of the temperature equalizing ring. When the energy of a flash of light for irradiation is increased, the temperature equalizing ring vibrates violently to jump up in some cases. The vibrations and jumping of the temperature equalizing ring give rise to problems in which particles are created by the sliding movement of the temperature equalizing ring on a semiconductor wafer and in a chamber and in which the temperature equalizing ring can no longer hold a semiconductor wafer because of the misregistration thereof.

SUMMARY OF THE INVENTION

The present invention is intended for a heat treatment apparatus for heating a substrate by irradiating the substrate with a flash of light.

According to one aspect of the present invention, the heat treatment apparatus comprises: a chamber for receiving a substrate therein; a holder for holding the substrate in the chamber, the holder including a plurality of support members for supporting an outer peripheral edge of the substrate, the support members being made of a material selected from the group consisting of silicon carbide, aluminum nitride, graphite coated with silicon carbide, and silicon nitride; a flash lamp for irradiating a first surface of the substrate held by the holder with a flash of light; a halogen lamp for irradiating a second surface of the substrate held by the holder with light;

and a temperature measuring part for measuring the temperature of the substrate heated by the irradiation with light from the halogen lamp.

The heat treatment apparatus minimizes the disorder of the temperature distribution of the substrate due to the support members to achieve the uniform heating of the substrate. Also, there is an open space under the substrate. This facilitates the measurement of the temperature of the substrate with the temperature measuring part.

Preferably, each of the support members includes a first support inclined obliquely downwardly from the outside of the substrate toward the center thereof and abutting against the outer peripheral edge of the substrate.

This prevents the substrate from sliding sideways during the heat treatment.

Preferably, the heat treatment apparatus further comprises an annular member surrounding the substrate in non-contacting relationship, the annular member being made of a material selected from the group consisting of silicon carbide, aluminum nitride, graphite coated with silicon carbide, and silicon nitride.

This prevents the temperature decrease of a peripheral portion of the substrate, thereby to achieve the more uniform heating of the substrate.

Preferably, the heat treatment apparatus further comprises a pressure maintaining part for maintaining the gas pressure in the chamber at a pressure in the range of 50 to 500 Pa.

Thus, no heat convection occurs in the chamber. This prevents the temperature decrease, in particular, of an outer edge portion of the substrate resulting from the convection, thereby to achieve the more uniform heating of the substrate.

According to another aspect of the present invention, the heat treatment apparatus comprises: a chamber for receiving a substrate therein; a flash lamp for irradiating a first surface of the substrate held in the chamber with a flash of light; a halogen lamp for irradiating a second surface of the substrate with light; and a temperature equalizing ring abutting against or in close proximity to an edge portion of the substrate to surround the edge portion, the temperature equalizing ring including an annular portion and a reinforcing portion, the annular portion having an inner peripheral edge abutting against or in close proximity to the edge portion of the substrate, the annular portion being parallel to a main surface of the substrate, the reinforcing portion being provided in continuation to an outer peripheral edge of the annular portion, the reinforcing portion forming an angle greater than 0 degrees and less than 180 degrees with the annular portion.

If deforming stresses resulting from thermal expansion are exerted on the annular portion during the flash irradiation, the reinforcing portion provided at a predetermined angle with respect to the annular portion suppresses the deformation of the annular portion. This significantly suppresses the vibrations and jumping of the temperature equalizing ring during the flash irradiation to prevent the creation of particles and also to prevent the misregistration of the temperature equalizing ring.

Preferably, the heat treatment apparatus further comprises a support ring provided fixedly on an inner wall of the chamber, the temperature equalizing ring being fitted on the support ring.

This prevents the misregistration of the temperature equalizing ring with reliability if the temperature equalizing ring vibrates slightly during the flash irradiation.

Preferably, the heat treatment apparatus further comprises: a support ring provided fixedly on an inner wall of the chamber and having a flat portion parallel to the main surface of the substrate; and a protrusion provided on the flat portion and supporting the annular portion at a distance of not more than 2 mm from the flat portion.

A sticking effect during the flash irradiation exerts a force sticking to the flat portion of the support ring on the temperature equalizing ring to suppress the vibrations of the temperature equalizing ring with higher reliability.

Preferably, the temperature equalizing ring includes a first flat portion extending from the reinforcing portion in a direction opposite from the annular portion and parallel to the main surface of the substrate, and the heat treatment apparatus further comprises: a support ring provided fixedly on an inner wall of the chamber and having a second flat portion parallel to the main surface of the substrate; and a protrusion provided on the second flat portion and supporting the first flat portion at a distance of not more than 2 mm from the second flat portion.

The sticking effect during the flash irradiation exerts a force sticking to the second flat portion of the support ring on the temperature equalizing ring to suppress the vibrations of the temperature equalizing ring with higher reliability.

Preferably, the heat treatment apparatus further comprises a light shielding member for shielding at least part of the temperature equalizing ring against a flash of light.

This reduces the thermal expansion itself of the annular portion during the flash irradiation to suppress the vibrations of the temperature equalizing ring with higher reliability.

It is therefore an object of the present invention to heat a substrate uniformly.

It is another object of the present invention to suppress vibrations of a temperature equalizing ring during flash irradiation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 3 is an external perspective view of a support member according to a first preferred embodiment of the present invention;

FIG. 7 is a plan view showing an arrangement of halogen lamps;

FIG. 8 is a flow diagram showing a procedure for treatment of a semiconductor wafer in the heat treatment apparatus of FIG. 1;

FIG. 9 is an external perspective view of a support member according to a second preferred embodiment of the present invention;

FIG. 10 is a view schematically showing a semiconductor wafer held by the holder according to the second preferred embodiment;

FIG. 11 is a perspective view of support members and a temperature equalizing ring according to a third preferred embodiment of the present invention;

FIGS. 12A to 12C and FIG. 13 are perspective views showing other examples of the support members;

FIG. 14 is a longitudinal sectional view showing a configuration of a heat treatment apparatus according to a fourth preferred embodiment of the present invention;

FIG. 15 is a perspective view of a temperature equalizing ring according to the fourth preferred embodiment;

FIG. 16 is a side view of a holder holding a semiconductor wafer;

FIG. 18 is a side view of the holder according to a fifth preferred embodiment of the present invention;

FIG. 19 is a side view of the holder according to a sixth preferred embodiment of the present invention;

DESCRIPTION OF THE PREFERRED EMBODIMENTS

Preferred embodiments according to the present invention will now be described in detail with reference to the drawings.

First Preferred Embodiment

Figure 1:
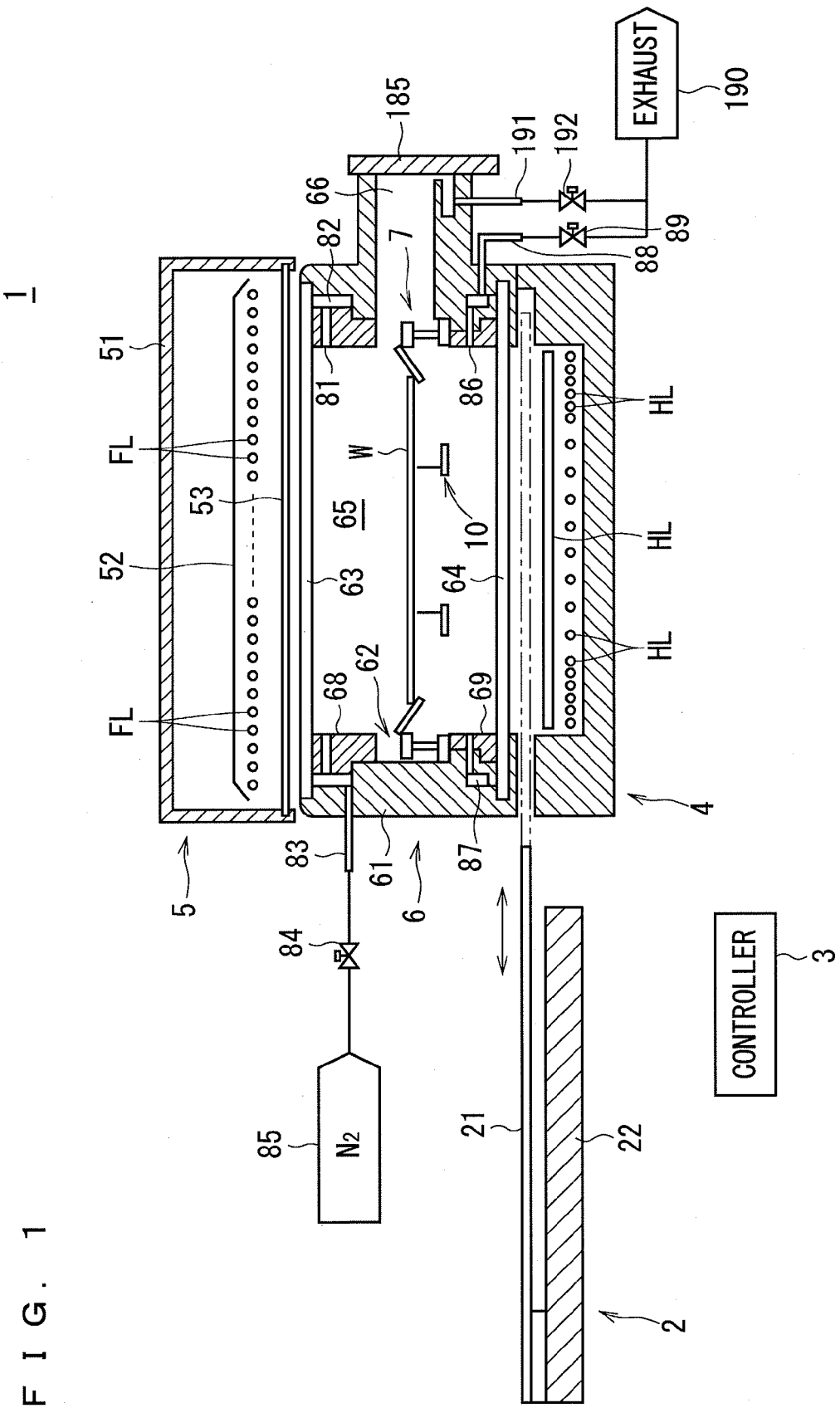
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to a first preferred embodiment of the present invention is a flash lamp annealer for irradiating a disk-shaped semiconductor wafer W having a diameter of 300 mm and serving as a substrate with a flash of light to heat the semiconductor wafer W. A semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. In FIG. 1 and the subsequent figures, the dimensions of components and the number of components are shown in exaggeration or in simplified form, as appropriate, for the sake of easier understanding.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

An O-ring not shown is inserted between each of the upper and lower chamber windows 63 and 64 and the chamber side portion 61. An O-ring is also inserted between the gate valve 185 and the transport opening 66 when the transport opening 66 is closed by the gate valve 185. Thus, when the transport opening 66 is closed by the gate valve 185, the heat treatment space 65 in the chamber 6 is sealed off from the outside of the heat treatment apparatus 1. This allows the pressure in the heat treatment space 65 to increase to atmospheric pressure or higher and to decrease to a vacuum atmosphere.

At least one gas supply opening 81 for supplying an inert gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. The exhaust part 190 includes a dry pump and a throttle valve, for example. A valve 89 is inserted at some midpoint in the gas exhaust pipe 88. When the dry pump of the exhaust part 190 is actuated while the valve 89 is open, the gas in the heat treatment space 65 is exhausted through the gas exhaust opening 86 and the buffer space 87 to the gas exhaust pipe 88. The flow rate of the exhausted gas is regulated by the throttle valve of the exhaust part 190. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. The holder 7 includes a base ring 71, a support ring 72, and a plurality of support members 75. The support ring 72 is a plate-like member in the shape of an annular ring made of quartz, and has an inside diameter greater than the diameter (300 mm) of the semiconductor wafer W. The base ring 71 is an annular ring-shaped member identical in shape with the support ring 72 and made of quartz. The base ring 71 and the support ring 72 are coupled to each other with a plurality of (in this preferred embodiment, three) coupling members 73. For example, quartz members having the shape of a prism may be used as the coupling members 73. The base ring 71 and the support ring 72 coupled to each other are opposed to each other so that their central axes coincide with each other.

The support members 75 are provided fixedly on the inner periphery of the support ring 72. The number of support members 75 provided on the support ring 72 is in the range of 3 to 12. In the first preferred embodiment, three support members 75 are spaced 120 degrees apart from each other along the inner periphery of the support ring 72. FIG. 3 is an external perspective view of such a support member 75. Each of the support members 75 according to the first preferred embodiment is a member having a cylindrical shape and made of silicon carbide (SiC). Sintered SiC may be used for the support members 75.

Figure 4:
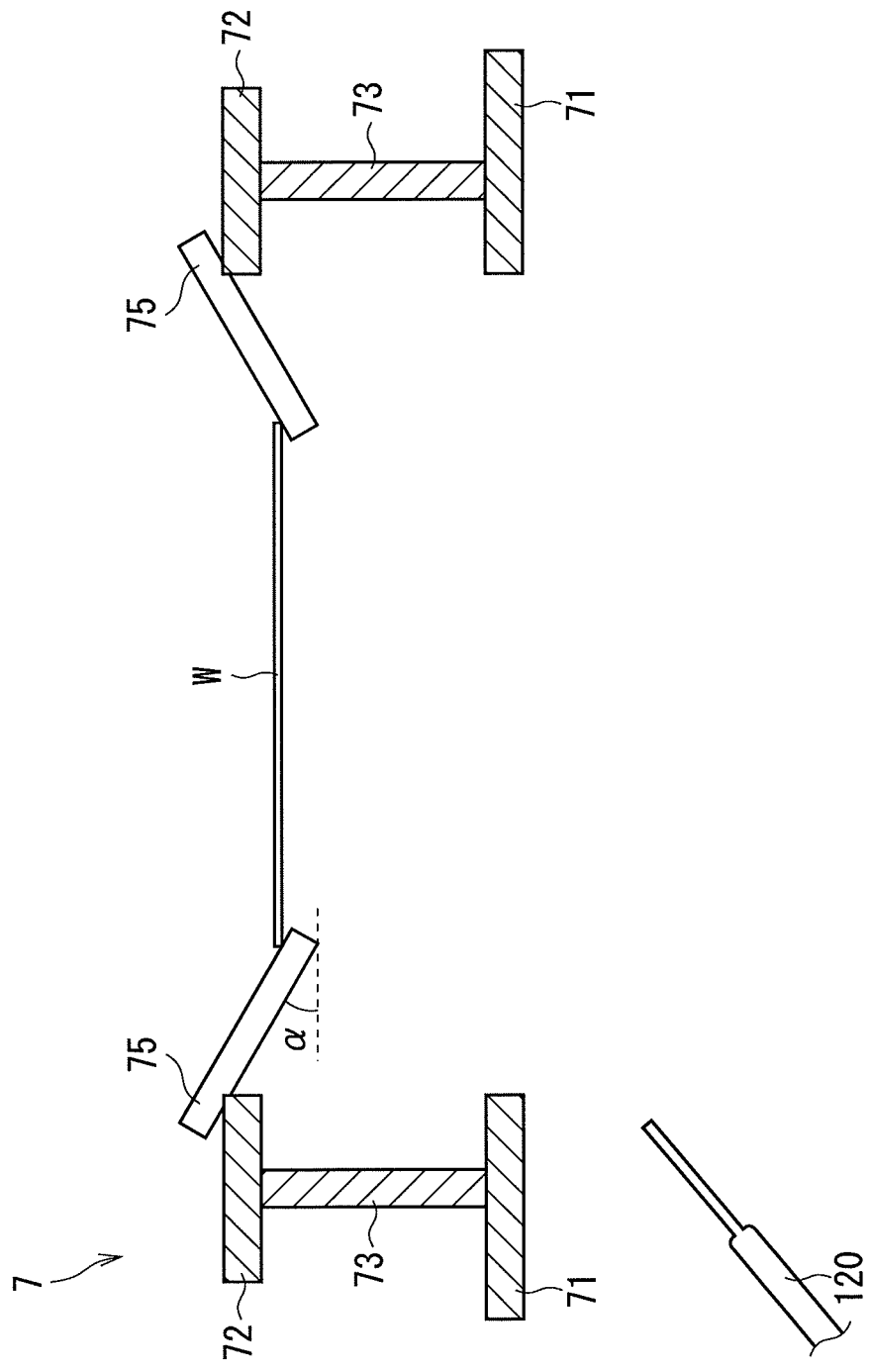
FIG. 4 is a view schematically showing a semiconductor wafer held by the holder according to the first preferred embodiment.

FIG. 4 is a view schematically showing a semiconductor wafer W held by the holder 7. The base ring 71 is provided fixedly on the wall surface of the chamber 6 by being fixed and mounted on the bottom surface of the recessed portion 62 (with reference to FIG. 1). An example of the technique of fixedly providing the base ring 71 in the chamber 6 includes fixing the base ring 71 on the bottom surface of the recessed portion 62 with pins. The base ring 71 is fixed and mounted in the chamber 6, whereby the entire holder 7 including the support ring 72 and the three support members 75 is provided fixedly in the chamber 6.

Each of the support members 75 is provided on the support ring 72 so that the axis of the cylindrical shape thereof is inclined obliquely downwardly from the outside of the semiconductor wafer W to be held toward the center thereof. The support members 75 form an angle $\alpha$ in the range of 15 to 30 degrees with a horizontal plane. In other words, the support members 75 are inclined at an angle in the range of 15 to 30 degrees with respect to a horizontal plane. As shown in FIG. 4, the outer peripheral edge of the semiconductor wafer W is supported at three points by the peripheral surfaces of the three support members 75 provided on the support ring 72. Specifically, the three inclined support members 75 abut against the outer peripheral edge of the semiconductor wafer W, and support the outer peripheral edge of the semiconductor wafer W in a horizontal attitude (an attitude such that the normal to the semiconductor wafer W coincides with a vertical direction) at three points. The vertical position of the semiconductor wafer W supported by the three support members 75 is slightly lower than that of the support ring 72.

A radiation thermometer 120 is provided in the chamber 6. The radiation thermometer 120 is capable of receiving radiant light (infrared light) emitted from the lower surface of the semiconductor wafer W supported by the three support members 75 to measure the temperature of the semiconductor wafer W. The semiconductor wafer W is supported at its outer peripheral edge by the three support members 75, and the inside of the base ring 71 in the shape of an annular ring is open. This enables the radiation thermometer 120 to receive the radiant light emitted from the lower surface of the semiconductor wafer W with reliability.

Figure 5:
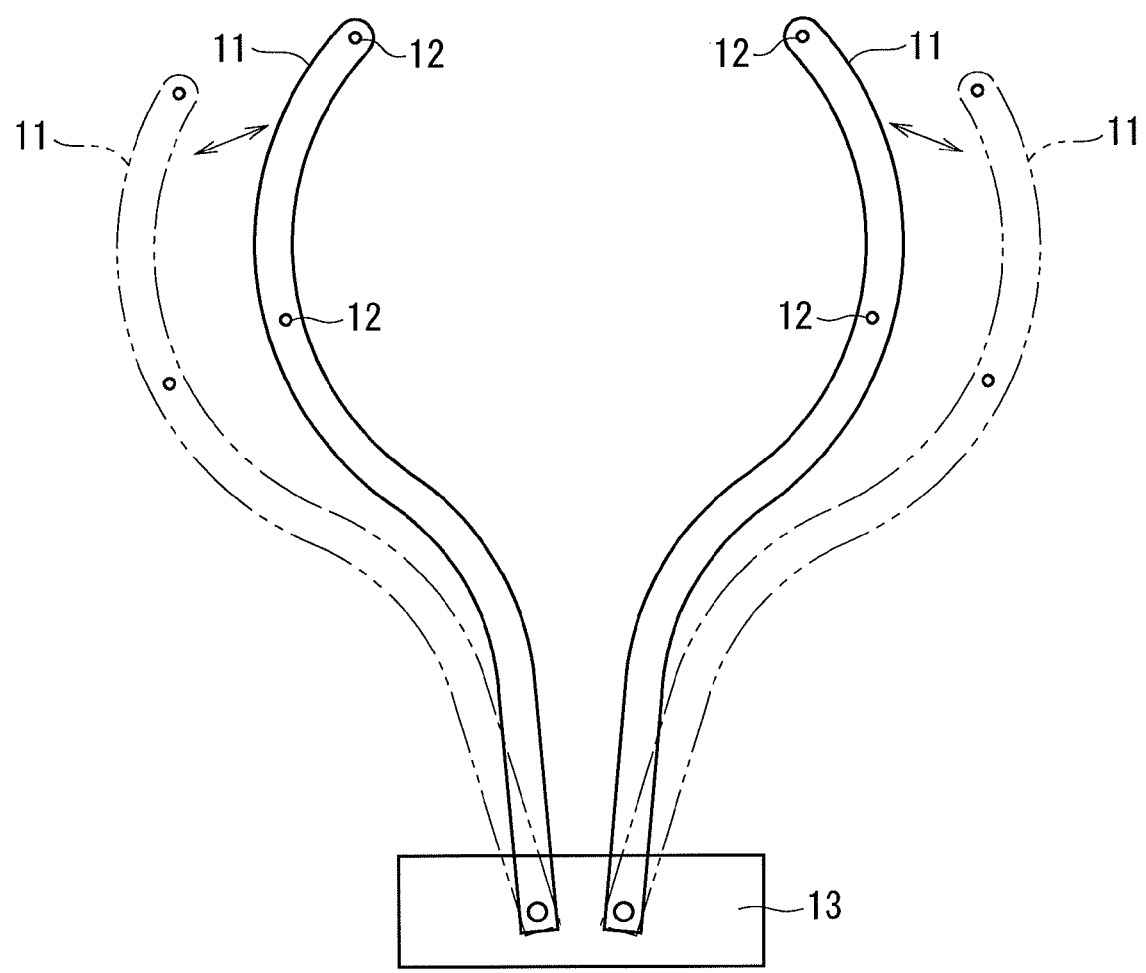
FIG. 5 is a plan view of a transfer mechanism.
Figure 6:
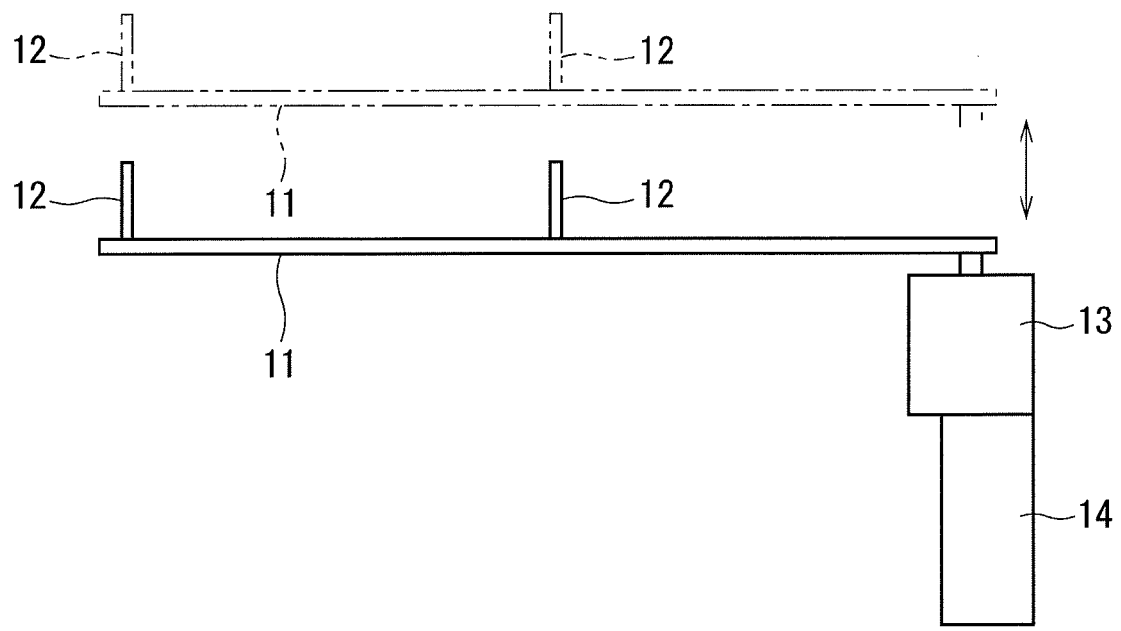
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes a pair of lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the inside space of the holder 7 until the upper ends of the lift pins 12 reach a vertical position above the upper surface of the support ring 72. On the other hand, as the elevating mechanism 14 moves down the pair of transfer arms 11 in their transfer operation position to move the lift pins 12 below the base ring 71 and the horizontal movement mechanism 13 moves the pair of transfer arms 11 so as to open the transfer arms 11, the transfer arms 11 move to their retracted position. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The multiple (in the present preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In the present preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals near the edges of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the heat treatment space 65. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate of silicon implanted with impurities (ions) by an ion implantation process. The impurities are activated by the heat treatment apparatus 1 performing the process of heating (annealing) the semiconductor wafer W by flash irradiation. FIG. 8 is a flow diagram showing a procedure for the treatment of a semiconductor wafer W in the heat treatment apparatus 1. The procedure for the treatment of a semiconductor wafer W which will be described below proceeds under the control of the controller 3 over the operating mechanisms of the heat treatment apparatus 1.

First, the gate valve 185 is opened to open the transport opening 66. A transport robot outside the heat treatment apparatus 1 transports a semiconductor wafer W implanted with impurities through the transport opening 66 into the heat treatment space 65 of the chamber 6 (in Step S1). When the transport opening 66 is opened for the transport of a semiconductor wafer W into the heat treatment space 65, the valve 84 for supply of gas may be opened to supply an inert gas such as nitrogen gas through the gas supply opening 81 into the heat treatment space 65, thereby preventing outside atmosphere containing particles from flowing into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the inside space of the holder 7 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the three support members 75 of the holder 7 (in Step S2). As shown in FIG. 4, the three support members 75 support the outer peripheral edge of the semiconductor wafer W in a horizontal attitude at three points. The semiconductor wafer W is held by the holder 7 in such an attitude that a surface thereof which is patterned and implanted with impurities is the upper surface. The pair of transfer arms 11 moved downwardly below the holder 7 is moved back to the retracted position.

After the transport opening 66 is closed and the semiconductor wafer W is held by the holder 7, the pressure in the chamber 6 is decreased (in Step S3). The gate valve 185 closes the transport opening 66 to cause the heat treatment space 65 to become an enclosed space. When the valve 89 is opened in this state while the dry pump of the exhaust part 190 is in operation, the gas in the heat treatment space 65 is exhausted through the gas exhaust opening 86, so that the pressure in the chamber 6 is decreased to a low vacuum of less than 100 Pa.

Subsequently, while the exhaust part 190 exhausts the gas, an inert gas is supplied into the chamber 6 (in Step S4). In the present preferred embodiment, the valve 84 is opened, so that nitrogen gas is supplied through the gas supply opening 81 into the chamber 6 in which a low vacuum is produced by the exhaust part 190 that exhausts the gas. At this time, while the nitrogen gas is supplied at a constant flow rate into the heat treatment space 65 of the chamber 6, the flow rate of the gas being exhausted is regulated using the degree of opening and closing of the throttle valve of the exhaust part 190, whereby the pressure in the chamber 6 is maintained at a low vacuum in the range of 50 to 500 Pa. In the present preferred embodiment, the pressure in the chamber 6 is maintained at approximately 100 Pa.

After the pressure in the chamber 6 reaches a predetermined target gas pressure (100 Pa) and stabilizes, the 40 halogen lamps HL in the halogen heating part 4 turn on simultaneously to start preheating (or assist-heating) (in Step S5). Halogen light emitted from the halogen lamps HL is transmitted through the lower chamber window 64 made of quartz, and impinges upon the back surface (a main surface subjected to no patterning on the opposite side from the front surface) of the semiconductor wafer W. The semiconductor wafer W is preheated by being irradiated with the halogen light from the halogen lamps HL, so that the temperature of the semiconductor wafer W increases. The transfer arms 11 and the lift pins 12 of the transfer mechanism 10 do not become an obstacle to the heating using the halogen lamps HL because the transfer arms 11 are moved back to the retracted position and because the transfer arms 11 and the lift pins 12 are made of transparent quartz.

The temperature of the semiconductor wafer W is measured with a temperature sensor when the halogen lamps HL perform the preheating. The radiation thermometer 120 (with reference to FIG. 4), for example, may be used as the temperature sensor. In the present preferred embodiment, there is a wide open space under the semiconductor wafer W held by the holder 7. This enables the radiation thermometer 120 to receive radiant light emitted from the lower surface of the semiconductor wafer W with reliability, thereby precisely measuring the temperature of the semiconductor wafer W. Alternatively, a contact-type thermometer including a thermocouple may be used as the temperature sensor. The temperature of the semiconductor wafer W measured with the temperature sensor is transmitted to the controller 3.

The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL, based on the value measured with the temperature sensor, so that the temperature of the semiconductor wafer W is equal to the preheating temperature T1. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the time when the temperature of the semiconductor wafer W measured with the temperature sensor reaches the preheating temperature T1, the controller 3 controls the output from the halogen lamps HL to maintain the temperature of the semiconductor wafer W at approximately the preheating temperature T1.

Next, the front surface of the semiconductor wafer W is irradiated with a flash of light from the flash lamps FL of the flash heating part 5 (in Step S6) when a predetermined time period has elapsed since the temperature of the semiconductor wafer W reached the preheating temperature T1. In this step, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W. In the first preferred embodiment, a flash of light is emitted from the flash lamps FL while the three support members 75 of the holder 7 support the semiconductor wafer W at three points.

The flash heating, which is achieved by the emission of a flash of light from the flash lamps FL, increases the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the previously stored electrostatic energy into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. Also, the oxidation of the front surface of the semiconductor wafer W on the molecular level is prevented because the front surface of the semiconductor wafer W is heated to the treatment temperature T2 in a low vacuum of 100 Pa. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

The halogen lamps HL turn off after a predetermined time period has elapsed since the completion of the flash heating treatment (in Step S7). At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases. The radiation thermometer 120 also measures the temperature of the semiconductor wafer W which is on the decrease. The results of measurement are transmitted to the controller 3. In addition to the decrease in the temperature of the semiconductor wafer W, the valve 89 is closed to stop exhausting the gas, and the supply of nitrogen gas into the heat treatment space 65 is continued, so that the pressure in the chamber 6 is returned to the previous pressure (in Step S9).

The controller 3 monitors whether the temperature of the semiconductor wafer W measured with the radiation thermometer 120 is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, whereby the lift pins 12 pass through the inside space of the holder 7 to receive the heat-treated semiconductor wafer W from the three support members 75. Subsequently, the transport opening 66 which has been closed is opened by the gate valve 185, and the transport robot outside the heat treatment apparatus 1 transports the semiconductor wafer W placed on the lift pins 12 to the outside (in Step S10). Thus, the heat treatment apparatus 1 completes the heating treatment of the semiconductor wafer W.

In the first preferred embodiment, the semiconductor wafer W is preheated by being irradiated with the halogen light from the halogen lamps HL while the semiconductor wafer W is supported at its outer peripheral edge by the three support members 75 having a cylindrical shape and made of silicon carbide. The support members 75 for direct contact with the semiconductor wafer W are made of silicon carbide which absorbs halogen light better than quartz. During the preheating, the temperature of the three support members 75 hence increases as the temperature of the semiconductor wafer W increases. This prevents the local temperature decrease of the semiconductor wafer W resulting from the conduction of heat to the support members 75.

Also, the three inclined support members 75 support the outer peripheral edge of the semiconductor wafer W in point contacting relationship, so that the contact between the holder 7 and the semiconductor wafer W is minimized. This minimizes the disorder of the temperature distribution of the semiconductor wafer W due to the support members 75 to achieve the uniform heating of the semiconductor wafer W.

Also, the support members 75 are inclined obliquely downwardly from the outside of the semiconductor wafer W to be held toward the center thereof. This prevents the semiconductor wafer W from sliding sideways during the heat treatment.

In the first preferred embodiment, the heat treatment of the semiconductor wafer W is performed while the pressure in the heat treatment space 65 of the chamber 6 is maintained at a low vacuum in the range of 50 to 500 Pa. Thus, no convection occurs on the upper surface of the semiconductor wafer W. This prevents the temperature decrease resulting from the fact that the atmosphere gas at a relatively low temperature strikes the peripheral portion of the semiconductor wafer W due to the convection, thereby to achieve the more uniform heating of the semiconductor wafer W.

The three support members 75 support the outer peripheral edge of the semiconductor wafer W, and the inside of the annular base ring 71 is open. This enables the radiation thermometer 120 to receive radiant light emitted from the lower surface of the semiconductor wafer W with reliability, thereby precisely measuring the temperature of the semiconductor wafer W.

Second Preferred Embodiment

Next, a second preferred embodiment according to the present invention will be described. A heat treatment apparatus according to the second preferred embodiment is similar in overall configuration to that according to the first preferred embodiment. The second preferred embodiment is also similar in procedure for the treatment of a semiconductor wafer W to the first preferred embodiment. The second preferred embodiment differs from the first preferred embodiment in the shape of the support members of the holder 7.

FIG. 9 is an external perspective view of a support members 175 according to the second preferred embodiment. The support member 175 according to the second preferred embodiment includes a first support 176 inclined obliquely downwardly, and a second support 177 provided at a tip of the first support 176 and extending in a horizontal direction. Each of the first support 176 and the second support 177 is an elongated rectangular member having the shape of a quadrangular prism and made of silicon carbide.

FIG. 10 is a view schematically showing a semiconductor wafer W held by the holder 7 according to the second preferred embodiment. The support ring 72 made of quartz is coupled to the base ring 71 with the coupling members 73 as in the first preferred embodiment. The base ring 71 is fixed and mounted on the bottom surface of the recessed portion 62, whereby the entire holder 7 is provided fixedly in the chamber 6.

A plurality of support members 175 each shown in FIG. 9 are provided fixedly on the inner periphery of the support ring 72 as in the first preferred embodiment. The number of support members 175 provided on the support ring 72 is in the range of 3 to 12. In the second preferred embodiment, three support members 175 are spaced 120 degrees apart from each other along the inner periphery of the support ring 72. In each of the support members 175, the first support 176 is provided on the support ring 72 so that the axis of the quadrangular prism thereof is inclined obliquely downwardly from the outside of the semiconductor wafer W to be held toward the center thereof. The first support 176 is inclined at an angle in the range of 15 to 30 degrees with respect to a horizontal plane. In each of the support members 175, the second support 177 is provided so that the axis of the quadrangular prism thereof extends in a horizontal direction from the tip of the first support 176.

As shown in FIG. 10, the second supports 177 of the three respective support members 175 in the second preferred embodiment abut against the lower surface of the peripheral portion of the semiconductor wafer W to support the semiconductor wafer W. Specifically, the second supports 177 extending in a horizontal direction abut against the lower surface of the peripheral portion of the semiconductor wafer W to support the outer peripheral edge of the semiconductor wafer W in a horizontal attitude. The second supports 177 may extend approximately 100 mm from the outer peripheral edge of the semiconductor wafer W having a diameter of 300 mm toward the center thereof. The vertical position of the semiconductor wafer W supported by the three support members 175 is slightly lower than that of the support ring 72.

As in the first preferred embodiment, the semiconductor wafer W is supported at its outer peripheral edge by the three support members 175, and the inside of the base ring 71 in the shape of an annular ring is open. This enables the radiation thermometer 120 to receive the radiant light emitted from the lower surface of the semiconductor wafer W with reliability, thereby precisely measuring the temperature of the semiconductor wafer W.

Also in the second preferred embodiment, the semiconductor wafer W is preheated by being irradiated with the halogen light from the halogen lamps HL while the semiconductor wafer W is supported at its outer peripheral edge by the three support members 175 made of silicon carbide. This prevents the local temperature decrease of the semiconductor wafer W resulting from the support members 175 to achieve the uniform heating of the semiconductor wafer W.

Third Preferred Embodiment

Next, a third preferred embodiment according to the present invention will be described. A heat treatment apparatus according to the third preferred embodiment is similar in overall configuration to that according to the first preferred embodiment. The third preferred embodiment is also similar in procedure for the treatment of a semiconductor wafer W to the first preferred embodiment. In the third preferred embodiment, the holder 7 includes a temperature equalizing ring surrounding a semiconductor wafer W.

FIG. 11 is a perspective view of the support members and the temperature equalizing ring according to the third preferred embodiment. The support members 175 in the third preferred embodiment are similar to those in the second preferred embodiment. As in the second preferred embodiment, the three support members 175 are provided fixedly on the inner periphery of the support ring 72 (not shown in FIG. 11). In the third preferred embodiment, a temperature equalizing ring 278 is provided on the upper surface of the second supports 177 of the three support members 175. The temperature equalizing ring 278 is a plate-like member in the shape of an annular ring, and has an inside diameter slightly greater than the diameter of the semiconductor wafer W. The temperature equalizing ring 278 is made of silicon carbide.

As shown in FIG. 11, the second supports 177 extending in a horizontal direction in the third preferred embodiment also abut against the lower surface of the peripheral portion of the semiconductor wafer W to support the outer peripheral edge of the semiconductor wafer W in a horizontal attitude. The semiconductor wafer W supported by the second supports 177 are surrounded by the temperature equalizing ring 278 in non-contacting relationship. The vertical position of the semiconductor wafer W supported by the second supports 177 is substantially the same as that of the temperature equalizing ring 278.

Also in the third preferred embodiment, the semiconductor wafer W is preheated by being irradiated with the halogen light from the halogen lamps HL while the semiconductor wafer W is supported at its outer peripheral edge by the three support members 175 made of silicon carbide. This prevents the local temperature decrease of the semiconductor wafer W resulting from the support members 175 to achieve the uniform heating of the semiconductor wafer W.

Furthermore, the temperature equalizing ring 278 similar to the support members 175 in being made of silicon carbide surrounds the semiconductor wafer W in non-contacting relationship in the third preferred embodiment. The temperature of the temperature equalizing ring 278 is increased to an extent similar to that of the support members 175 by absorbing the halogen light from the halogen lamps HL. The temperature equalizing ring 278 the temperature of which is increased surrounds the semiconductor wafer W. Thus, if heat convection occurs within the chamber 6, the temperature equalizing ring 278 prevents the heat convection from striking the peripheral portion of the semiconductor wafer W, thereby preventing the temperature decrease of the peripheral portion. As a result, this achieves the more uniform heating of the semiconductor wafer W.

Fourth Preferred Embodiment

FIG. 14 is a longitudinal sectional view showing a configuration of a heat treatment apparatus 1a according to a fourth preferred embodiment of the present invention. Like reference numerals and characters are used in FIG. 14 to designate components identical with those in FIG. 1. The heat treatment apparatus 1a according to the fourth preferred embodiment is a flash lamp annealer for irradiating a disk-shaped silicon semiconductor wafer W having a diameter of 300 mm and serving as a substrate with a flash of light to heat the semiconductor wafer W. A semiconductor wafer W prior to the transport into the heat treatment apparatus 1a is implanted with impurities. The heat treatment apparatus 1a performs a heating treatment on the semiconductor wafer W to thereby activate the impurities implanted in the semiconductor wafer W. The heat treatment apparatus 1a according to the fourth preferred embodiment differs from the heat treatment apparatus 1 according to the first preferred embodiment in the configuration of a holder 307. The remaining parts of the fourth preferred embodiment are identical in configuration with those of the first preferred embodiment.

The holder 307 in the fourth preferred embodiment includes a temperature equalizing ring 371, and a support ring 375. FIG. 15 is a perspective view of the temperature equalizing ring 371. FIG. 16 is a side view of the holder 307 holding a semiconductor wafer W. The temperature equalizing ring 371 is a member in the shape of an annular ring surrounding an edge portion of a disk-shaped semiconductor wafer W having a diameter of 300 mm, and includes an annular portion 372 and a reinforcing portion 373. The temperature equalizing ring 371 in the fourth preferred embodiment is made of silicon carbide (SiC).

The annular portion 372 is a planar member in the shape of an annular ring. A collar 372a is provided at the inner peripheral edge of the annular portion 372 in the fourth preferred embodiment, and supports the lower surface of the edge portion of the semiconductor wafer W. Specifically, the annular portion 372 at the inner peripheral edge abuts against the edge portion of the semiconductor wafer W to support the semiconductor wafer W. The annular portion 372 in the shape of an annular ring has an outside diameter greater than the diameter of the semiconductor wafer W. Thus, the annular portion 372 abuts against the edge portion of the semiconductor wafer W to surround the edge portion. The annular portion 372 is parallel to a main surface of the semiconductor wafer W supported by the temperature equalizing ring 371.

The reinforcing portion 373 is a cylindrical member provided in continuation to the outer peripheral edge of the annular portion 372. In the fourth preferred embodiment, the annular portion 372 and the reinforcing portion 373 form an angle of 90 degrees with each other. In other words, the reinforcing portion 373 is provided so as to be bent downwardly perpendicularly from the outer peripheral edge of the annular portion 372. Thus, as shown in FIG. 16, the temperature equalizing ring 371 is of an L-shaped cross-sectional configuration. The temperature equalizing ring 371 of such a configuration may be produced by integrally molding the annular portion 372 and the reinforcing portion 373, for example, using sintered SiC.

The support ring 375 is a member in the shape of an annular ring made of transparent quartz. The support ring 375 is provided fixedly on the inner wall surface of the chamber 6 by being fixed and mounted on the bottom surface of the recessed portion 62 (with reference to FIG. 14). An example of the technique of fixedly providing the support ring 375 in the chamber 6 includes fixing the support ring 375 on the bottom surface of the recessed portion 62 with pins.

In the fourth preferred embodiment, the support ring 375 made of quartz is also of an L-shaped cross-sectional configuration. The temperature equalizing ring 371 is fitted on the support ring 375 provided fixedly on the inner wall surface of the chamber 6 so that the L-shaped configuration of the support ring 375 and the L-shaped configuration of the temperature equalizing ring 371 are in engagement with each other. Thus, the entire holder 307 including the temperature equalizing ring 371 is provided fixedly in the chamber 6.

The semiconductor wafer W is supported in a horizontal attitude (an attitude such that the normal to the semiconductor wafer W coincides with a vertical direction) by the temperature equalizing ring 371 of the holder 307 provided fixedly on the inner wall of the chamber 6. The annular portion 372 of the temperature equalizing ring 371, which is parallel to a main surface of the semiconductor wafer W, is also in a horizontal attitude. The reinforcing portion 373 perpendicular to the annular portion 372 extends in a vertical direction.

A radiation thermometer not shown is provided in the chamber 6. The radiation thermometer is capable of receiving radiant light (infrared light) emitted from the lower surface of the semiconductor wafer W supported by the temperature equalizing ring 371 to measure the temperature of the semiconductor wafer W. The semiconductor wafer W is supported at its edge portion by the annular portion 372, and there is an open space under the lower surface of the semiconductor wafer W except the edge portion. This enables the radiation thermometer to receive the radiant light emitted from the lower surface of the semiconductor wafer W with reliability.

Figure 17:
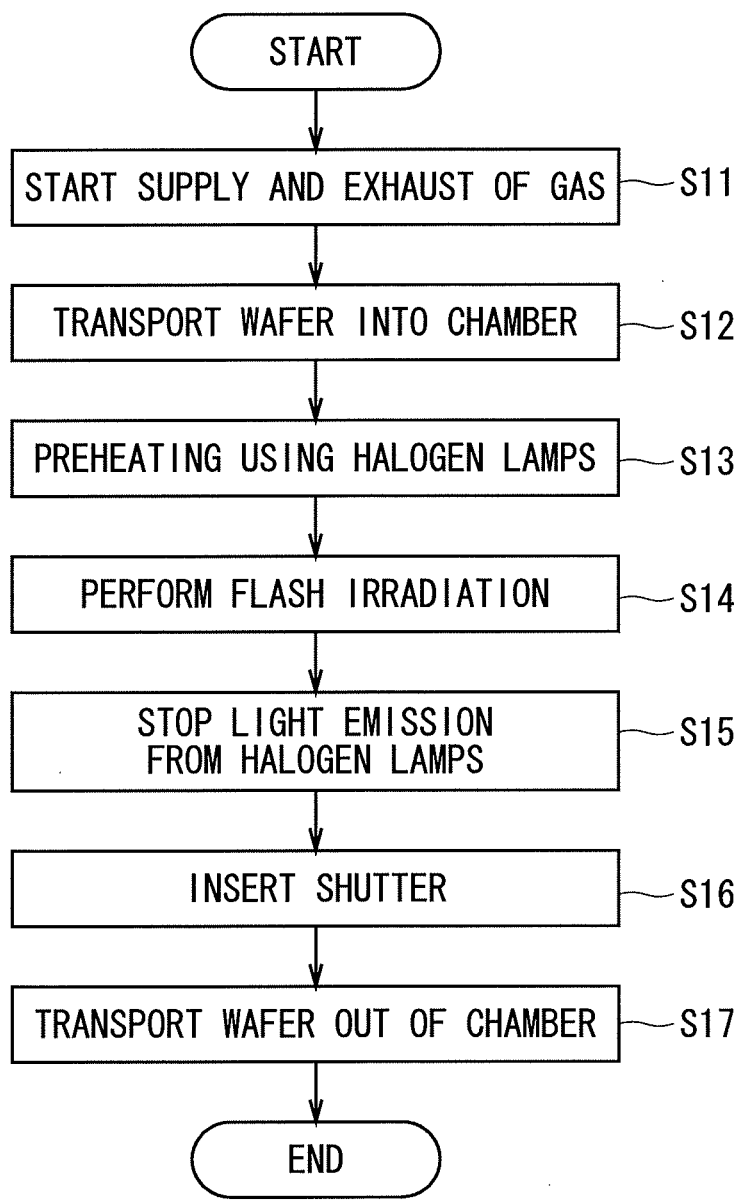
FIG. 17 is a flow diagram showing a procedure for treatment of a semiconductor wafer in the heat treatment apparatus according to the fourth preferred embodiment.

Next, a procedure for the treatment of a semiconductor wafer W in the heat treatment apparatus 1a will be described. A semiconductor wafer W to be treated herein is a semiconductor substrate of silicon implanted with impurities (ions) by an ion implantation process. The impurities are activated by the heat treatment apparatus 1a performing the process of heating (annealing) the semiconductor wafer W by flash irradiation. FIG. 17 is a flow diagram showing a procedure for the treatment of a semiconductor wafer W in the heat treatment apparatus 1a according to the fourth preferred embodiment. The procedure for the treatment of a semiconductor wafer W which will be described below proceeds under the control of the controller 3 over the operating mechanisms of the heat treatment apparatus 1a.

First, the valve 84 is opened for supply of gas, and the valves 89 and 192 for exhaust of gas are opened, so that the supply and exhaust of gas into and out of the chamber 6 start (in Step S11). When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1a. The amount of nitrogen gas supplied into the heat treatment space 65 is changed as appropriate in accordance with the process steps of FIG. 17.

Subsequently, the gate valve 185 is opened to open the transport opening 66. A transport robot outside the heat treatment apparatus 1a transports a semiconductor wafer W implanted with impurities through the transport opening 66 into the heat treatment space 65 of the chamber 6 (in Step S12). The semiconductor wafer W transported into the heat treatment space 65 by the transport robot is moved forward to a position lying immediately over the holder 307 and is stopped thereat. Then, the pair of transfer arms 11 of the transfer mechanism 10 is moved horizontally from the retracted position to the transfer operation position and is then moved upwardly, whereby the lift pins 12 pass through the inside space of the temperature equalizing ring 371 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the temperature equalizing ring 371 of the holder 307. As shown in FIG. 16, the temperature equalizing ring 371, at the inner peripheral edge of the annular portion 372, supports the entire perimeter of the edge portion of the semiconductor wafer W. The semiconductor wafer W is supported by the temperature equalizing ring 371 in such a horizontal attitude that a surface thereof which is patterned and implanted with impurities is the upper surface. The pair of transfer arms 11 moved downwardly below the holder 307 is moved back to the retracted position by the horizontal movement mechanism 13.

After the semiconductor wafer W is supported by the temperature equalizing ring 371 of the holder 307, the 40 halogen lamps HL in the halogen heating part 4 turn on simultaneously to start preheating (or assist-heating) (in Step S13). Halogen light emitted from the halogen lamps HL is transmitted through the lower chamber window 64 made of quartz, and impinges upon the back surface (a main surface subjected to no patterning on the opposite side from the front surface) of the semiconductor wafer W. The semiconductor wafer W is preheated by being irradiated with the halogen light from the halogen lamps HL, so that the temperature of the semiconductor wafer W increases. The transfer arms 11 and the lift pins 12 of the transfer mechanism 10 do not become an obstacle to the heating using the halogen lamps HL because the transfer arms 11 are moved back to the retracted position and because the transfer arms 11 and the lift pins 12 are made of transparent quartz.

The temperature of the semiconductor wafer W is measured with a temperature sensor when the halogen lamps HL perform the preheating. A radiation thermometer, for example, may be used as the temperature sensor. In the fourth preferred embodiment, there is a wide open space under the semiconductor wafer W supported by the temperature equalizing ring 371. This enables the radiation thermometer to receive radiant light emitted from the lower surface of the semiconductor wafer W with reliability, thereby precisely measuring the temperature of the semiconductor wafer W. Alternatively, a contact-type thermometer including a thermocouple may be used as the temperature sensor. The temperature of the semiconductor wafer W measured with the temperature sensor is transmitted to the controller 3.

The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the temperature sensor, so that the temperature of the semiconductor wafer W is equal to the preheating temperature T1. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the time when the temperature of the semiconductor wafer W measured with the temperature sensor reaches the preheating temperature T1, the controller 3 controls the output from the halogen lamps HL to maintain the temperature of the semiconductor wafer W at approximately the preheating temperature T1.

Next, the front surface of the semiconductor wafer W is irradiated with a flash of light from the flash lamps FL of the flash heating part 5 (in Step S14) when a predetermined time period has elapsed since the temperature of the semiconductor wafer W reached the preheating temperature T1. In this step, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W. In the fourth preferred embodiment, a flash of light is emitted from the flash lamps FL while the temperature equalizing ring 371 of the holder 307 supports the edge portion of the semiconductor wafer W.

The flash heating, which is achieved by the emission of a flash of light from the flash lamps FL, increases the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the previously stored electrostatic energy into such an ultrashort light pulse. The temperature of the front surface of the semiconductor wafer W subjected to the flash heating by the flash irradiation from the flash lamps FL momentarily increases to the treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1a achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

The halogen lamps HL turn off after a predetermined time period has elapsed since the completion of the flash heating treatment (in Step S15). At the same time that the halogen lamps HL turn off, the shutter mechanism 2 inserts the shutter plate 21 into the light shielding position lying between the halogen heating part 4 and the chamber 6 (in Step S16). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases. The temperature sensor also measures the temperature of the semiconductor wafer W which is on the decrease. The results of measurement are transmitted to the controller 3.

The controller 3 monitors whether the temperature of the semiconductor wafer W measured with the temperature sensor is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, whereby the lift pins 12 pass through the inside space of the temperature equalizing ring 371 to receive the heat-treated semiconductor wafer W from the temperature equalizing ring 371. Subsequently, the transport opening 66 which has been closed is opened by the gate valve 185, and the transport robot outside the heat treatment apparatus 1a transports the semiconductor wafer W placed on the lift pins 12 to the outside (in Step S17). Thus, the heat treatment apparatus 1a completes the heating treatment of the semiconductor wafer W.

In the fourth preferred embodiment, the cylindrical reinforcing portion 373 is perpendicularly provided on the outer peripheral edge of the annular portion 372 which is a planar member in the shape of an annular ring, so that the temperature equalizing ring 371 is of an L-shaped cross-sectional configuration. The temperature equalizing ring 371 made of silicon carbide absorbs a flash of light. In particular, the upper surface of the annular portion 372 parallel to a main surface of the semiconductor wafer W directly receives and absorbs a flash of light emitted from the flash lamps FL, so that the temperature of the upper surface of the annular portion 372 momentarily increases abruptly. As a result, abrupt thermal expansion of only the upper surface of the annular portion 372 in the temperature equalizing ring 371 occurs to exert deforming stresses on the annular portion 372. However, the provision of the reinforcing portion 373 perpendicular to the annular portion 372 suppresses the deformation of the annular portion 372 resulting from the thermal expansion thereof. This significantly suppresses the vibrations and jumping of the temperature equalizing ring 371 during the flash irradiation to prevent the creation of particles resulting from such behaviors of the temperature equalizing ring 371. Also, the suppression of the vibrations of the temperature equalizing ring 371 prevents the misregistration of the temperature equalizing ring 371. Thus, the semiconductor wafer W is supported with reliability.

The temperature equalizing ring 371 made of silicon carbide also absorbs the halogen light emitted from the halogen lamps HL. Thus, the temperature equalizing ring 371 as well as the semiconductor wafer W absorbs the halogen light during the preheating using the halogen lamps HL, so that the temperature thereof increases. Such a temperature equalizing ring 371 surrounds the edge portion of the semiconductor wafer W to prevent the temperature decrease of the peripheral portion of the semiconductor wafer W where the temperature decrease is prone to occur in the stage of the preheating, thereby improving the uniformity of the in-plane temperature distribution of the semiconductor wafer W.

Also in the fourth preferred embodiment, the temperature equalizing ring 371 is fitted on the support ring 375 provided fixedly on the inner wall of the chamber 6 so that the L-shaped configuration of the support ring 375 and the L-shaped configuration of the temperature equalizing ring 371 are in engagement with each other. This prevents the misregistration of the temperature equalizing ring 371 with reliability if the temperature equalizing ring 371 vibrates slightly during the flash irradiation.

Fifth Preferred Embodiment

Next, a fifth preferred embodiment according to the present invention will be described. A heat treatment apparatus according to the fifth preferred embodiment is similar in overall configuration to that according to the fourth preferred embodiment. The fifth preferred embodiment is also similar in procedure for the treatment of a semiconductor wafer W to the fourth preferred embodiment. The fifth preferred embodiment differs from the fourth preferred embodiment in the structure of the holder 307.

FIG. 18 is a side view of the holder 307 according to the fifth preferred embodiment. Reference numerals and characters similar to those in FIG. 16 are used in FIG. 18 to designate components identical with those in the fourth preferred embodiment. The holder 307 includes the temperature equalizing ring 371 and a support ring 475. The temperature equalizing ring 371 in the fifth preferred embodiment is similar to that in the fourth preferred embodiment. Specifically, the temperature equalizing ring 371 includes the annular portion 372 in the shape of an annular ring which at the inner peripheral edge abuts against the edge portion of a semiconductor wafer W to surround the edge portion, and the reinforcing portion 373 in a cylindrical shape which is provided perpendicularly in continuation to the outer peripheral edge of the annular portion 372. The annular portion 372 is parallel to a main surface of the semiconductor wafer W supported by the temperature equalizing ring 371. The temperature equalizing ring 371 is made of silicon carbide.

The support ring 475 is a member in the shape of an annular ring made of transparent quartz. As in the fourth preferred embodiment, the support ring 475 is provided fixedly on the inner wall surface of the chamber 6 by being fixed and mounted on the bottom surface of the recessed portion 62. The support ring 475 in the fifth preferred embodiment includes a flat portion 476 provided so as to be further bent inwardly perpendicularly from an end of the L-shaped cross-sectional configuration of the support ring 375 in the fourth preferred embodiment. The flat portion 476 is parallel to a main surface of the semiconductor wafer W supported by the temperature equalizing ring 371. The flat portion 476 accordingly has the shape of a flat annular ring.

A plurality of protrusions 477 are provided upright on the upper surface of the flat portion 476. The protrusions 477 are also made of quartz. The protrusions 477 have a height of not more than 2 mm as measured from the upper surface of the flat portion 476 to the tip thereof. In the fifth preferred embodiment, the temperature equalizing ring 371 is supported by the plurality of protrusions 477. More specifically, the annular portion 372 of the temperature equalizing ring 371 is supported by the plurality of protrusions 477 provided upright on the flat portion 476 of the support ring 475. Thus, the annular portion 372 parallel to a main surface of the semiconductor wafer W supported by the temperature equalizing ring 371 is supported in opposed relation to and at a distance of not more than 2 mm from the flat portion 476 parallel to a main surface of the semiconductor wafer W.

The area of part of the annular portion 372 of the temperature equalizing ring 371 which is opposed to the flat portion 476 is not less than one-third of the area of the annular portion 372. In other words, at least one-third of the area of the annular portion 372 of the temperature equalizing ring 371 is opposed to the flat portion 476 at a distance of not more than 2 mm therefrom.

In the fifth preferred embodiment, the semiconductor wafer W is supported in a horizontal attitude by the temperature equalizing ring 371 which in turn is supported by the support ring 475 via the protrusions 477. The preheating using the halogen lamps HL and the flash irradiation from the flash lamps FL as in the fourth preferred embodiment are performed on the semiconductor wafer W supported in this manner by the temperature equalizing ring 371.

Also in the fifth preferred embodiment, the cylindrical reinforcing portion 373 is perpendicularly provided on the outer peripheral edge of the annular portion 372 which is a planar member in the shape of an annular ring, so that the temperature equalizing ring 371 is of an L-shaped cross-sectional configuration. Thus, if deforming stresses resulting from the thermal expansion of the surface of the annular portion 372 are exerted on the annular portion 372 during the flash irradiation, the reinforcing portion 373 perpendicular to the annular portion 372 suppresses the deformation of the annular portion 372. This significantly suppresses the vibrations and jumping of the temperature equalizing ring 371 during the flash irradiation to prevent the creation of particles resulting from such behaviors of the temperature equalizing ring 371. Also, the suppression of the vibrations of the temperature equalizing ring 371 prevents the misregistration of the temperature equalizing ring 371. Thus, the semiconductor wafer W is supported with reliability.

The temperature equalizing ring 371 made of silicon carbide surrounds the edge portion of the semiconductor wafer W to prevent the temperature decrease of the peripheral portion of the semiconductor wafer W where the temperature decrease is prone to occur in the stage of the preheating, thereby improving the uniformity of the in-plane temperature distribution of the semiconductor wafer W.

Further, the annular portion 372 of the temperature equalizing ring 371 in the fifth preferred embodiment is supported in opposed relation to and at a distance of not more than 2 mm from the flat portion 476 of the support ring 475. Thus, a sticking effect suppresses the vibrations and jumping of the temperature equalizing ring 371 with higher reliability during the flash irradiation. The term "sticking effect" refers to an effect such that, if the temperature equalizing ring 371 is about to vibrate or jump during the flash irradiation, the narrow spacing of not more than 2 mm between the annular portion 372 and the flat portion 476 is put under a negative pressure because it is difficult for gas to enter the narrow space, so that a force sticking to the flat portion 476 is exerted on the annular portion 372. To produce such a sticking effect, it is desirable that the area of part of the annular portion 372 which is opposed to the flat portion 476 is not less than one-third of the area of the annular portion 372.

Sixth Preferred Embodiment

Next, a sixth preferred embodiment according to the present invention will be described. A heat treatment apparatus according to the sixth preferred embodiment is similar in overall configuration to that according to the fourth preferred embodiment. The sixth preferred embodiment is also similar in procedure for the treatment of a semiconductor wafer W to the fourth preferred embodiment. The sixth preferred embodiment differs from the fourth preferred embodiment in the structure of the holder 307.

FIG. 19 is a side view of the holder 307 according to the sixth preferred embodiment. Reference numerals and characters similar to those in FIG. 16 are used in FIG. 19 to designate components identical with those in the fourth preferred embodiment. The holder 307 includes a temperature equalizing ring 471 and a support ring 575. Although the flat portion in the fifth preferred embodiment extends from an end of the L-shaped configuration of the support ring, a flat portion in the sixth preferred embodiment extends from an end of the L-shaped configuration of the temperature equalizing ring. The temperature equalizing ring 471 in the sixth preferred embodiment is a member in the shape of an annular ring surrounding an edge portion of a disk-shaped semiconductor wafer W, and includes the annular portion 372, the reinforcing portion 373 and a flat portion 374. As in the fourth preferred embodiment, the temperature equalizing ring 471 is made of silicon carbide.

The annular portion 372 is a member in the shape of an annular ring which at the inner peripheral edge abuts against the edge portion of the semiconductor wafer W to support the semiconductor wafer W and which surrounds the edge portion. Also, the annular portion 372 is parallel to a main surface of the semiconductor wafer W supported by the temperature equalizing ring 471. The reinforcing portion 373 is a cylindrical member provided in continuation to the outer peripheral edge of the annular portion 372.

The temperature equalizing ring 471 in the sixth preferred embodiment includes the flat portion 374 provided so as to be further bent outwardly perpendicularly from an end of the L-shaped cross-sectional configuration formed by the annular portion 372 and the reinforcing portion 373. That is, the flat portion 374 extends from the lower edge of the reinforcing portion 373 in a direction opposite from the annular portion 372. The flat portion 374 is parallel to the annular portion 372, that is, parallel to a main surface of the semiconductor wafer W supported by the temperature equalizing ring 471. Thus, the flat portion 374 has the shape of a flat annular ring.

The support ring 575 is a member in the shape of an annular ring made of transparent quartz. As in the fourth preferred embodiment, the support ring 575 is provided fixedly on the inner wall surface of the chamber 6 by being fixed and mounted on the bottom surface of the recessed portion 62. The support ring 575 in the sixth preferred embodiment includes a flat portion 576 having the shape of a flat annular ring. The flat portion 576 is parallel to a main surface of the semiconductor wafer W supported by the temperature equalizing ring 471.

A plurality of protrusions 577 are provided upright on the upper surface of the flat portion 576 in the shape of an annular ring. The protrusions 577 are also made of quartz. The protrusions 577 have a height of not more than 2 mm as measured from the upper surface of the flat portion 576 to the tip thereof. In the sixth preferred embodiment, the temperature equalizing ring 471 is supported by the plurality of protrusions 577. More specifically, the flat portion 374 of the temperature equalizing ring 471 is supported by the plurality of protrusions 577 provided upright on the flat portion 576 of the support ring 575. Thus, the flat portion 374 of the temperature equalizing ring 471 parallel to a main surface of the semiconductor wafer W supported by the temperature equalizing ring 471 is supported in opposed relation to and at a distance of not more than 2 mm from the flat portion 576 of the support ring 575 similarly parallel to the main surface of the semiconductor wafer W.

The area of part of the flat portion 374 of the temperature equalizing ring 471 which is opposed to the flat portion 576 of the support ring 575 is not less than one-third of the area of the flat portion 374. In other words, at least one-third of the area of the flat portion 374 of the temperature equalizing ring 471 is opposed to the flat portion 576 at a distance of not more than 2 mm therefrom.

In the sixth preferred embodiment, the semiconductor wafer W is supported in a horizontal attitude by the temperature equalizing ring 471 which in turn is supported by the support ring 575 via the protrusions 577. The preheating using the halogen lamps HL and the flash irradiation from the flash lamps FL as in the fourth preferred embodiment are performed on the semiconductor wafer W supported in this manner by the temperature equalizing ring 471.

Also in the sixth preferred embodiment, the cylindrical reinforcing portion 373 is perpendicularly provided on the outer peripheral edge of the annular portion 372 which is a planar member in the shape of an annular ring. Thus, if deforming stresses resulting from the thermal expansion of the surface of the annular portion 372 are exerted on the annular portion 372 during the flash irradiation, the reinforcing portion 373 perpendicular to the annular portion 372 suppresses the deformation of the annular portion 372. This significantly suppresses the vibrations and jumping of the temperature equalizing ring 471 during the flash irradiation to prevent the creation of particles resulting from such behaviors of the temperature equalizing ring 471. Also, the suppression of the vibrations of the temperature equalizing ring 471 prevents the misregistration of the temperature equalizing ring 471. Thus, the semiconductor wafer W is supported with reliability.

The temperature equalizing ring 471 made of silicon carbide surrounds the edge portion of the semiconductor wafer W to prevent the temperature decrease of the peripheral portion of the semiconductor wafer W where the temperature decrease is prone to occur in the stage of the preheating, thereby improving the uniformity of the in-plane temperature distribution of the semiconductor wafer W.

Further, the flat portion 374 of the temperature equalizing ring 471 in the sixth preferred embodiment is supported in opposed relation to and at a distance of not more than 2 mm from the flat portion 576 of the support ring 575. Thus, the sticking effect as in the fifth preferred embodiment is produced during the flash irradiation to exert a force sticking to the flat portion 576 of the support ring 575 on the temperature equalizing ring 471. This suppresses the vibrations and jumping of the temperature equalizing ring 471 with higher reliability.

In particular, the flat portion 374 extends from an end of the L-shaped configuration of the temperature equalizing ring 471 in the sixth preferred embodiment. This makes the distance between the semiconductor wafer W supported by the temperature equalizing ring 471 and the support ring 575 longer than that in the fifth preferred embodiment. This further reduces the influence of the support ring 575 made of quartz which is difficult to increase in temperature during the preheating upon the temperature of the edge portion of the semiconductor wafer W.

Seventh Preferred Embodiment

Figure 20:
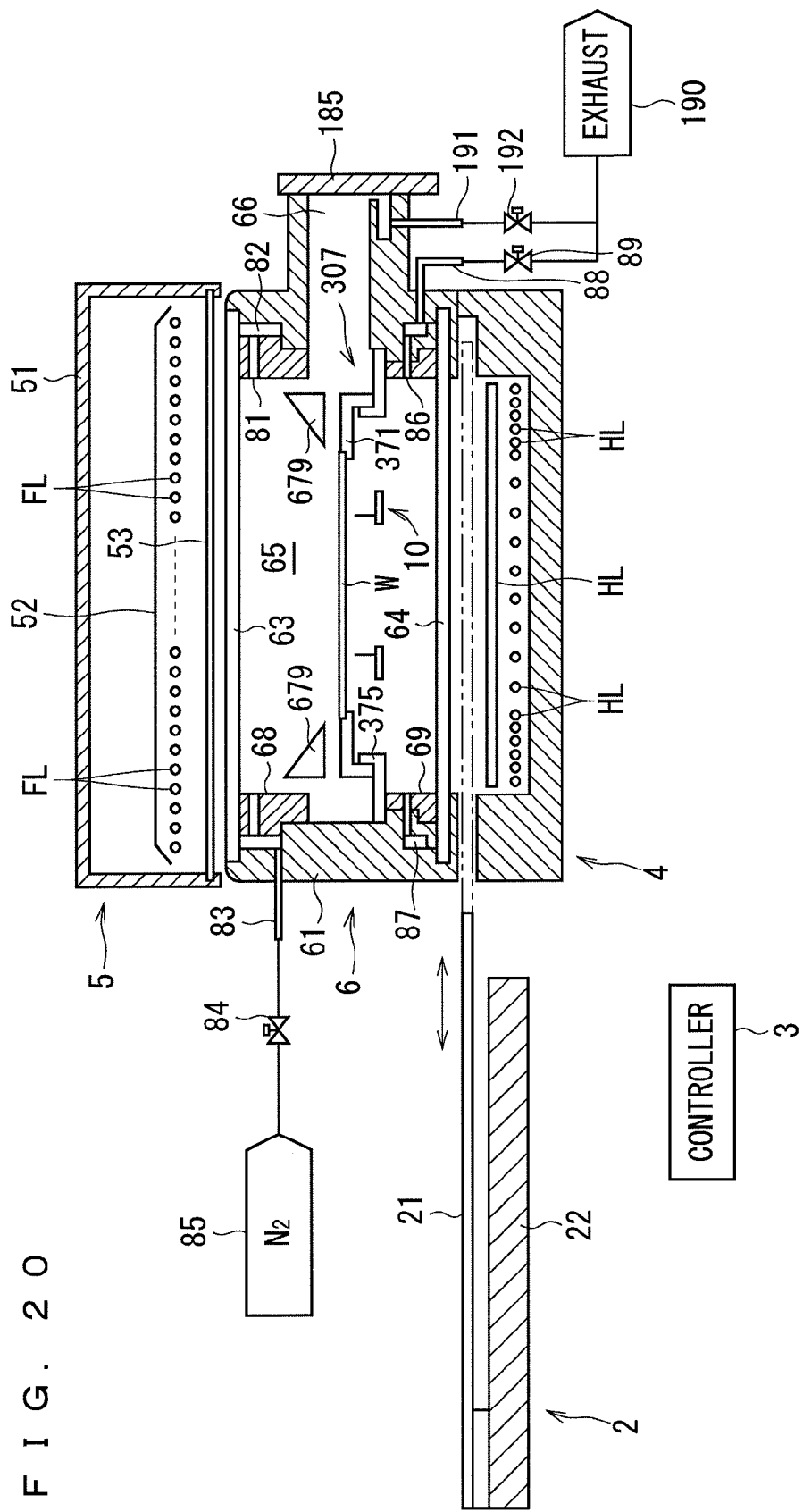
FIG. 20 is a longitudinal sectional view showing a configuration of a heat treatment apparatus according to a seventh preferred embodiment of the present invention.

Next, a seventh preferred embodiment according to the present invention will be described. FIG. 20 is a longitudinal sectional view showing a configuration of a heat treatment apparatus according to the seventh preferred embodiment. Reference numerals and characters similar to those in FIG. 14 are used in FIG. 20 to designate components identical with those in the fourth preferred embodiment. The heat treatment apparatus according to the seventh preferred embodiment differs from that according to the fourth preferred embodiment in comprising a light shielding ring 679 over the temperature equalizing ring 371.

The light shielding ring 679 is an annular ring-shaped member of a triangular cross-sectional configuration. The light shielding ring 679 is made of a metal material (e.g., stainless steel) opaque to a flash of light from the flash lamps FL. The light shielding ring 679 in the shape of an annular ring has an inside diameter greater than the diameter of the semiconductor wafer W and smaller than the outside diameter of the temperature equalizing ring 371. The light shielding ring 679 has an outside diameter approximately equal to the outside diameter of the temperature equalizing ring 371.

In the seventh preferred embodiment, such a light shielding ring 679 is provided in a vertical position lying over the temperature equalizing ring 371 and spaced a predetermined distance apart from the upper surface of the annular portion 372. The light shielding ring 679 is provided fixedly on the inner wall of the chamber 6. The remaining parts of the seventh preferred embodiment except the light shielding ring 679 are identical in configuration with those of the fourth preferred embodiment.

The seventh preferred embodiment is also similar in procedure for the treatment of a semiconductor wafer W to the fourth preferred embodiment. In the seventh preferred embodiment, the preheating using the halogen lamps HL and the flash irradiation from the flash lamps FL as in the fourth preferred embodiment are performed on the semiconductor wafer W supported in a horizontal attitude by the temperature equalizing ring 371 fitted on the support ring 375.

This also produces effects similar to those of the fourth preferred embodiment. In addition, the light shielding ring 679 opaque to flashes of light (i.e., which does not allow flashes of light to pass through) is provided over the temperature equalizing ring 371 in the seventh preferred embodiment. Thus, at least part of the upper surface of the temperature equalizing ring 371 is shielded against flashes of light by the light shielding ring 679. This reduces the thermal expansion itself of the surface of the annular portion 372 during the flash irradiation to suppress the vibrations and jumping of the temperature equalizing ring with higher reliability.

Eighth Preferred Embodiment

Next, an eighth preferred embodiment according to the present invention will be described. A heat treatment apparatus according to the eighth preferred embodiment is similar in overall configuration to that according to the fourth preferred embodiment. The eighth preferred embodiment is also similar in procedure for the treatment of a semiconductor wafer W to the fourth preferred embodiment. The eighth preferred embodiment differs from the fourth preferred embodiment in the structure of the holder 307 and in the technique of thereby supporting a semiconductor wafer W.

Figure 21:
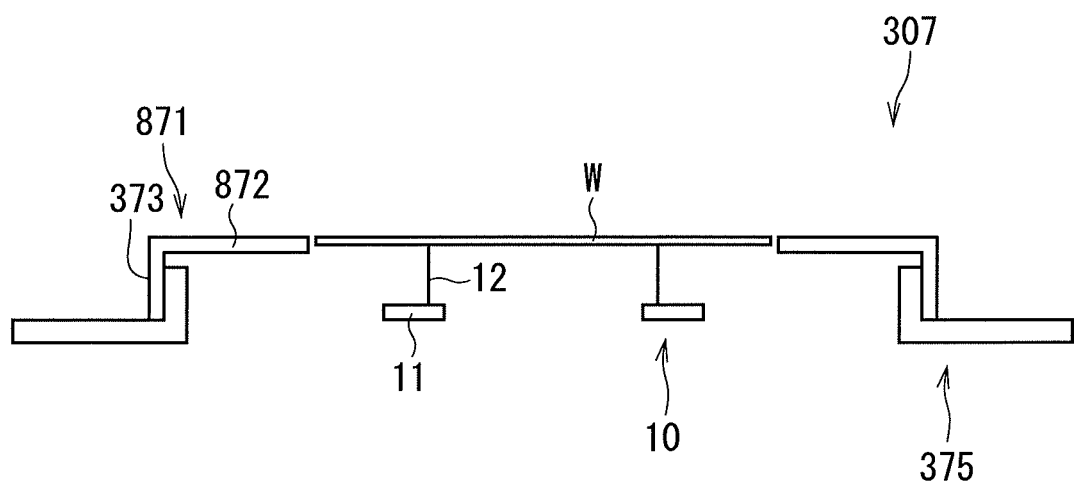
FIG. 21 is a side view of the holder according to an eighth preferred embodiment of the present invention.

FIG. 21 is a side view of the holder 307 according to the eighth preferred embodiment. Like reference numerals and characters are used in FIG. 21 to designate components identical with those in the seventh preferred embodiment. The holder 307 includes a temperature equalizing ring 871 and the support ring 375. The temperature equalizing ring 871 is substantially similar to the temperature equalizing ring 371 of the fourth preferred embodiment, but has an inside diameter slightly greater than the diameter of a semiconductor wafer W. Specifically, the temperature equalizing ring 871 in the eighth preferred embodiment is also a member in the shape of an annular ring surrounding an edge portion of a disk-shaped semiconductor wafer W, and includes an annular portion 872 and the reinforcing portion 373. As in the fourth preferred embodiment, the temperature equalizing ring 871 is made of silicon carbide.

The annular portion 872 in the eighth preferred embodiment is also a planar member in the shape of an annular ring, but has an inside diameter slightly greater than the diameter of the semiconductor wafer W. Thus, the inner peripheral edge of the annular portion 872 in the shape of an annular ring is in close proximity to the edge portion of the semiconductor wafer W in non-contacting relationship. The annular portion 872 has an outside diameter greater than the diameter of the semiconductor wafer W. Thus, the annular portion 872 is in close proximity to the edge portion of the semiconductor wafer W to surround the edge portion. The reinforcing portion 373, on the other hand, is a cylindrical member provided in continuation to the outer peripheral edge of the annular portion 872 as in the fourth preferred embodiment.

In the eighth preferred embodiment, the semiconductor wafer W is not supported by the annular portion 872 of the temperature equalizing ring 871 because the inside diameter of the annular portion 872 is greater than the diameter of the semiconductor wafer W. For this reason, the total of four lift pins 12 of the transfer mechanism 10 support the lower surface of the semiconductor wafer W in the eighth preferred embodiment. The annular portion 872 of the temperature equalizing ring 871 is in close proximity to the edge portion of the semiconductor wafer W supported by the lift pins 12 of the transfer mechanism 10 to surround the edge portion. The annular portion 872 is parallel to a main surface of the semiconductor wafer W supported by the transfer mechanism 10.

After receiving a semiconductor wafer W from the transport robot outside the heat treatment apparatus, the lift pins 12 of the transfer mechanism 10 in the eighth preferred embodiment support the semiconductor wafer W in a vertical position substantially the same as that of the annular portion 872 of the temperature equalizing ring 871. Then, the preheating using the halogen lamps HL and the flash irradiation from the flash lamps FL are performed on the semiconductor wafer W supported in a horizontal attitude inside the annular portion 872 by the lift pins 12. The transfer arms 11 and the lift pins 12 of the transfer mechanism 10 do not become an obstacle to the heating using the halogen lamps HL because the transfer arms 11 and the lift pins 12 are made of transparent quartz.

Thus, the temperature equalizing ring 871 made of silicon carbide surrounds the edge portion of the semiconductor wafer W to prevent the temperature decrease of the peripheral portion of the semiconductor wafer W where the temperature decrease is prone to occur in the stage of the preheating, thereby improving the uniformity of the in-plane temperature distribution of the semiconductor wafer W as in the fourth preferred embodiment.

Also in the eighth preferred embodiment, the cylindrical reinforcing portion 373 is perpendicularly provided on the outer peripheral edge of the annular portion 872 which is a planar member in the shape of an annular ring, so that the temperature equalizing ring 871 is of an L-shaped cross-sectional configuration. Thus, if deforming stresses resulting from the thermal expansion of the surface of the annular portion 872 are exerted on the annular portion 872 during the flash irradiation, the reinforcing portion 373 perpendicular to the annular portion 872 suppresses the deformation of the annular portion 872. This significantly suppresses the vibrations and jumping of the temperature equalizing ring 871 during the flash irradiation to prevent the creation of particles resulting from such behaviors of the temperature equalizing ring 871. Also, the suppression of the vibrations of the temperature equalizing ring 871 prevents the misregistration of the temperature equalizing ring 871. Thus, the semiconductor wafer W is supported with reliability.

<Modifications>

While the preferred embodiments according to the present invention have been described hereinabove, various modifications of the present invention in addition to those described above may be made without departing from the scope and spirit of the invention. For example, each of the support members 75 in the first preferred embodiment is in a cylindrical shape, but may have shapes as shown in FIGS. 12A to 12C. A support member 75 shown in FIG. 12A has the shape of a quadrangular prism. A support member 75 shown in FIG. 12B has the shape of a quadrangular prism which is elongated rectangular. In either case, such support members 75 each shown in FIG. 12A or 12B are provided on the support ring 72 so that the axis of the quadrangular prism thereof is inclined obliquely downwardly from the outside of a semiconductor wafer W to be held toward the center thereof. The support members 75 form an angle in the range of 15 to 30 degrees with a horizontal plane. The inclined support members 75 abut against the outer peripheral edge of the semiconductor wafer W to support the semiconductor wafer W.

A support member 75 shown in FIG. 12C is configured such that a protrusion 79 is provided at an edge of the elongated rectangular quadrangular prism of FIG. 12B. Such support members 75 each shown in FIG. 12C are provided on the support ring 72 in the aforementioned manner so that the axis of the quadrangular prism thereof is inclined obliquely downwardly from the outside of a semiconductor wafer W to be held toward the center thereof. The support members 75 each shown in FIG. 12C support the semiconductor wafer W in such a manner that the protrusion 79 abuts against the lower surface of the peripheral portion of the semiconductor wafer W to support the semiconductor wafer W.

Figure 13:
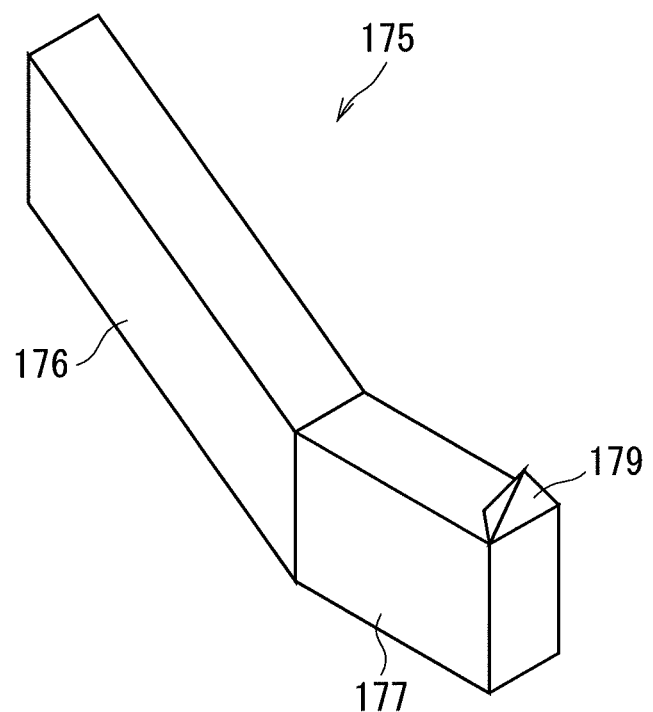

Each of the support members 175 in the second preferred embodiment may have a shape as shown in FIG. 13. A support member 175 shown in FIG. 13 is configured such that a protrusion 179 is provided at an edge of a support member 175 similar to that of the second preferred embodiment, i.e. at an edge of the second support 177. The support members 175 each shown in FIG. 13 support the semiconductor wafer W in such a manner that the protrusion 179 abuts against the lower surface of the peripheral portion of the semiconductor wafer W.

Each of the support members 75 and 175 shown in FIGS. 12A, 12B, 12C and 13 supports the outer peripheral edge of the semiconductor wafer W. With the semiconductor wafer W supported at its outer peripheral edge by the support members 75 and 175, the semiconductor wafer W is irradiated with the halogen light from the halogen lamps HL. This prevents the local temperature decrease of the semiconductor wafer W to achieve the uniform heating of the semiconductor wafer W. The protrusions 79 and 179 support the semiconductor wafer W to thereby prevent the local temperature decrease of the semiconductor wafer W with higher reliability. Further, the support member 75 having the shape of a quadrangular prism which is elongated rectangular is excellent in strength in the direction of the thickness thereof.

The support members 75 in the first preferred embodiment and the support members 175 in the second preferred embodiment are made of silicon carbide. However, the material of the support members 75 and 175 is not limited to this, but may include aluminum nitride (AlN), graphite coated with silicon carbide, and silicon nitride (SiN). Aluminum nitride used herein may be white or black in color. Graphite coated with silicon carbide may be produced by CVD-SiC coating. These materials absorb halogen light better than quartz. Thus, when the support members 75 and 175 are irradiated with the halogen light from the halogen lamps HL, the temperature of the support members 75 and 175 increases as the temperature of the semiconductor wafer W increases. This prevents the local temperature decrease of the semiconductor wafer W.

The material of the temperature equalizing ring 278 in the third preferred embodiment is not limited to silicon carbide, but may include black aluminum nitride, graphite coated with silicon carbide, and silicon nitride.

The vertical position of the semiconductor wafer W supported by the support members 75 and 175 may be the same as that of the support ring 72. However, when the vertical position of the semiconductor wafer W supported by the support members 75 and 175 is slightly lower than that of the support ring 72 as in the aforementioned preferred embodiments, the radiation thermometer 120 receives radiant light emitted from the lower surface of the semiconductor wafer W with higher reliability.

In the first to third preferred embodiments, the support ring 72 and the base ring 71 are coupled to each other with the coupling members 73. However, the base ring 71 is not necessarily required. Specifically, the holder 7 including the support ring 72 may be provided fixedly in the chamber 6 by fixing the coupling members 73 directly on the inner wall of the chamber 6.

The inert gas supplied through the gas supply opening 81 into the chamber 6 while the exhaust part 190 exhausts the gas is not limited to nitrogen gas, but may include argon (Ar) gas and helium (He) gas.

The angle formed by the annular portion 372 and the reinforcing portion 373 is 90 degrees in the fourth to eighth preferred embodiments, but is not limited to this. This angle is required only to be greater than 0 degrees and less than 180 degrees. In other words, it is only necessary that the reinforcing portion 373 is not parallel to the annular portion 372. To produce the effect of suppressing the deformation of the annular portion 372 during the flash irradiation, it is however preferable that the angle formed by the annular portion 372 and the reinforcing portion 373 is approximately in the range of 30 to 150 degrees.

The temperature equalizing ring 371 in the fourth to eighth preferred embodiments is made of silicon carbide. The material of the temperature equalizing ring 371 in the fourth to eighth preferred embodiments is not limited to this, but may include opaque ceramic such as aluminum nitride (AlN) and boron nitride (BN). Opaque ceramic the temperature of which is increased by absorbing halogen light is capable of preventing the temperature decrease of the peripheral portion of a semiconductor wafer W in the stage of the preheating. In consideration for durability to withstand the flash irradiation, it is however preferable that the temperature equalizing ring 371 is made of silicon carbide, aluminum nitride and boron nitride.

The support ring 375 in the fourth to eighth preferred embodiments is made of quartz. The material of the support ring 375 in the fourth to eighth preferred embodiments is not limited to this, but may include transparent materials such as sapphire ($Al_2O_3$) which allows the halogen light to pass through. Alternatively, the support ring 375 may be made of opaque ceramic such as silicon carbide similar to that for the temperature equalizing ring 371. However, when the support ring 375 is opaque, part of the halogen light directed toward the temperature equalizing ring 371 is intercepted by the support ring 375 during the preheating. This results in a danger that the temperature of the temperature equalizing ring 371 is not sufficiently increased. It is hence preferable that the support ring 375 is made of a transparent material such as quartz and sapphire. In particular, it is preferable that the temperature equalizing ring 371 is made of silicon carbide and the support ring 375 is made of quartz from the viewpoints of costs and durability to withstand the flash irradiation.

In the sixth preferred embodiment, the annular portion 372 is provided on the upper edge of the reinforcing portion 373 and the flat portion 374 is provided on the lower edge thereof (with reference to FIG. 19). However, the positions of the annular portion 372 and the flat portion 374 may be inverted. Specifically, the flat portion 374 may be provided above the semiconductor wafer W supported by the annular portion 372.

In the fifth and sixth preferred embodiments, the protrusions are provided upright on the flat portion of the support ring. However, the protrusions may be provided on the underside of the temperature equalizing ring.

Also, the light shielding ring 679 as in the seventh preferred embodiment may be applied to the fourth, fifth, sixth and eighth preferred embodiments. In the fourth to seventh preferred embodiments, the temperature equalizing ring may be in close proximity to the semiconductor wafer W supported by the lift pins 12 of the transfer mechanism 10 in non-contacting relationship as in the eighth preferred embodiment.

In the aforementioned preferred embodiments, the semiconductor wafer W is held in such an attitude that the front surface thereof which is patterned and implanted with impurities is the upper surface. However, the semiconductor wafer W may be inverted or flipped, i.e. held in such an attitude that the front surface thereof is the lower surface. In this case, the back surface of the semiconductor wafer W which is not patterned is irradiated with a flash of light (backside anneal).

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the joining of metal and silicon, and to the crystallization of polysilicon.

The technique according to the present invention is applicable to a laser annealer which heats a semiconductor wafer W by irradiating the semiconductor wafer W with laser light.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with a flash of light, comprising:
   a chamber for receiving a substrate therein;
   a flash lamp for irradiating a first surface of the substrate held in said chamber with a flash of light;
   a halogen lamp for irradiating a second surface of the substrate with light; and
   a temperature equalizing ring abutting against an edge portion of the substrate to surround the edge portion, said temperature equalizing ring including an annular portion, a collar, and a reinforcing portion, said annular portion being parallel to a main surface of the substrate, said collar being provided at the inner peripheral edge of said annular portion and supports the lower surface of the edge portion of the substrate, said reinforcing portion being provided in continuation to an outer peripheral edge of said annular portion, said reinforcing portion forming an angle greater than 0 degrees and less than 180 degrees with said annular portion.

2. The heat treatment apparatus according to claim 1, wherein
   said temperature equalizing ring is made of a material selected from the group consisting of silicon carbide, aluminum nitride, and boron nitride.

3. The heat treatment apparatus according to claim 1, wherein
   the angle formed by said annular portion and said reinforcing portion is 90 degrees.

4. The heat treatment apparatus according to claim 3, further comprising
   a support ring provided fixedly on an inner wall of said chamber,
   said temperature equalizing ring being fitted on said support ring.

5. The heat treatment apparatus according to claim 3, further comprising:
   a support ring provided fixedly on an inner wall of said chamber and having a flat portion parallel to the main surface of the substrate; and
   a protrusion provided on said flat portion and supporting said annular portion at a distance of not more than 2 mm from said flat portion.

6. The heat treatment apparatus according to claim 5, wherein
   the area of part of said annular portion opposed to said flat portion is not less than one-third of the area of the annular portion.

7. The heat treatment apparatus according to claim 3, wherein
   said temperature equalizing ring includes a first flat portion extending from said reinforcing portion in a direction opposite from said annular portion and parallel to the main surface of the substrate,
   said heat treatment apparatus further comprising:
   a support ring provided fixedly on an inner wall of said chamber and having a second flat portion parallel to the main surface of the substrate; and
   a protrusion provided on said second flat portion and supporting said first flat portion at a distance of not more than 2 mm from said second flat portion.

8. The heat treatment apparatus according to claim 1, further comprising
   a light shielding member for shielding at least part of said temperature equalizing ring against a flash of light.

* * * * *